(12) United States Patent
Muzzetto et al.

(10) Patent No.: US 11,705,211 B2
(45) Date of Patent: Jul. 18, 2023

(54) METHODS AND SYSTEMS FOR IMPROVING ACCESS TO MEMORY CELLS

(71) Applicant: Micron Technology, Inc., Boise, ID (US)

(72) Inventors: Riccardo Muzzetto, Arcore (IT); Umberto Di Vincenzo, Capriate San Gervasio (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 17/415,646

(22) PCT Filed: Jul. 14, 2020

(86) PCT No.: PCT/IB2020/020035
§ 371 (c)(1),
(2) Date: Jun. 17, 2021

(87) PCT Pub. No.: WO2022/013589
PCT Pub. Date: Jan. 20, 2022

(65) Prior Publication Data
US 2022/0319618 A1 Oct. 6, 2022

(51) Int. Cl.
*G11C 7/00* (2006.01)
*G11C 16/34* (2006.01)
(Continued)

(52) U.S. Cl.
CPC ........ *G11C 16/3459* (2013.01); *G11C 16/102* (2013.01); *G11C 16/22* (2013.01);
(Continued)

(58) Field of Classification Search
CPC ....... G11C 7/22; G11C 7/1078; G11C 7/1006; G11C 7/1072; G11C 7/1096
(Continued)

(56) References Cited

U.S. PATENT DOCUMENTS 7,957,187 B2   6/2011  Mokhlesi et al.
9,401,210 B2 *  7/2016  Kwon ................... G11C 16/08
(Continued)

FOREIGN PATENT DOCUMENTS

WO     2019126746      6/2019

OTHER PUBLICATIONS

ISA/KR, International Search Report and Written Opinion of the International Searching Authority, Int'l Appl. No. PCT/IB2020/020035, dated Mar. 31, 2021, Korean Intellectual Property Office, Seo-gu, Daejeon, Republic of Korea, 10 pgs.

*Primary Examiner* — Son T Dinh
(74) *Attorney, Agent, or Firm* — Holland & Hart LLP

(57) ABSTRACT

The present disclosure relates to a method for accessing an array of memory cells, including storing a set of user data in a plurality of memory cells, storing, in a portion of the array, additional information representative of a voltage difference between a first threshold voltage and a second threshold voltage of the memory cells programmed to a first logic state, applying to the array a read voltage to activate a first group of memory cells corresponding to a preset number of memory cells, determining that the first group of memory cells has been activated based on applying the read voltage, wherein the read voltage is equal to the first threshold voltage when the first group of memory cells has been activated, and based on the additional data information, applying the voltage difference to the array to activate a second group of memory cells programmed to the first logic state.

27 Claims, 12 Drawing Sheets

(51) Int. Cl.
*G11C 16/10* (2006.01)
*G11C 16/22* (2006.01)
*G11C 16/26* (2006.01)
*G11C 29/52* (2006.01)

(52) U.S. Cl.
CPC .......... *G11C 16/26* (2013.01); *G11C 16/3404* (2013.01); *G11C 29/52* (2013.01)

(58) Field of Classification Search
USPC .......................... 365/189.15, 189.16, 189.14
See application file for complete search history.

(56) References Cited

U.S. PATENT DOCUMENTS

| 10,116,336 B2* | 10/2018 | Hu .................... H03M 13/3738 |
| 2015/0178158 A1 | 6/2015 | Varanasi |
| 2017/0140802 A1 | 5/2017 | Jeon |
| 2019/0122726 A1 | 4/2019 | Sankaranarayanan et al. |

* cited by examiner

METHODS AND SYSTEMS FOR IMPROVING ACCESS TO MEMORY CELLS

CROSS REFERENCE

The present Application for Patent is a 371 national phase filing of International Patent Application No. PCT/IB2020/020035 by Muzzetto et al., titled "METHODS AND SYSTEMS FOR IMPROVING ACCESS TO MEMORY CELLS," filed Jul. 14, 2020, which is assigned to the assignee hereof and is expressly incorporated by reference in its entirety herein.

FIELD OF TECHNOLOGY

The present disclosure relates generally to operating an array memory of memory cells, and more particularly to improved write-based methods and systems for accessing memory cells.

BACKGROUND

Memory devices are used in many electronic systems such as mobile phones, personal digital assistants, laptop computers, digital cameras and the like. Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, non-volatile memory cells may maintain their stored logic state for extended periods of time even in the absence of an external power source. Volatile memory cells may lose their stored state over time unless they are periodically refreshed by an external power source.

Information is stored by programming different states of a memory device. For example, binary devices have two states, often denoted by a logic "1" or a logic "0." In other systems, more than two states may be stored. To access the stored information, a component of the memory device may read, or sense, the stored state. To store information, a component of the memory device may write, or program, the logic state.

Improving memory devices, generally, may include increasing memory cell density, increasing read/write speeds, increasing reliability, increasing data retention, reducing power consumption, reducing manufacturing costs, as well as scaling smaller than traditional devices (which may lead to relatively high rates of errors), and the like.

A more robust read technique may be desired to increase memory devices performances and reliability when memory cells exhibit variable electrical characteristics, in particular memory devices having a three-dimensional (3D) array of memory cells.

DETAILED DESCRIPTION

With reference to those drawings, methods and systems for an improved accessing operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Flash memories are well established and well suited for mass storage applications; however, their performances do not meet present day most demanding applications. New technologies, for example 3D Cross Point (3DXPoint) memories and Self-Selecting Memories (SSM) have better performances, for example in terms of access time and access granularity (data may be programmed and read with page, word or—in principle—even bit granularity). Accessing data during a read operation is more and more challenging with scaled technologies and the present disclosure provides for methods and systems for improved access operations.

Figure 1:
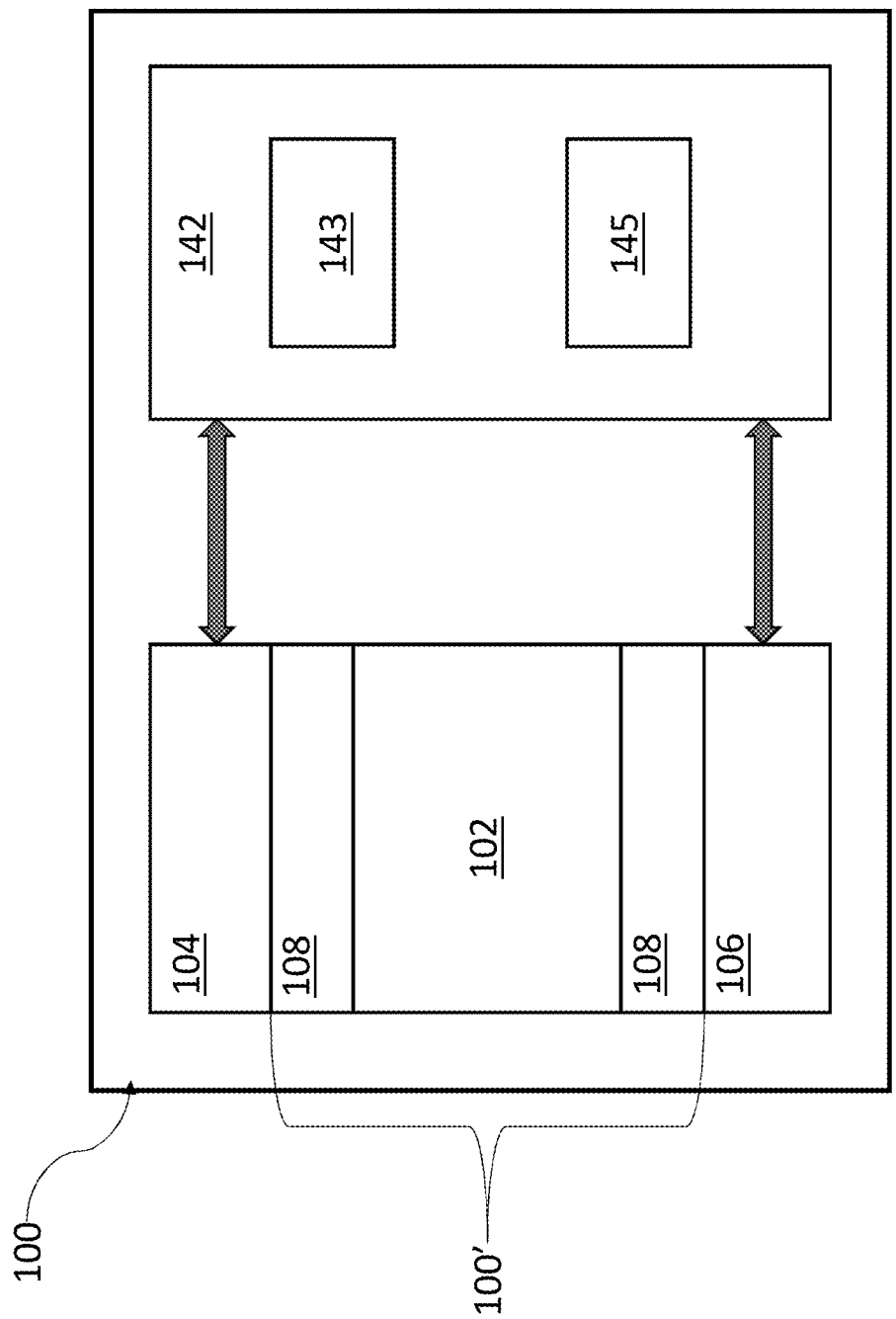
FIG. 1 is an exemplary block scheme illustrating an exemplary memory cell that can be read according to embodiments of the present disclosure.

FIG. 1 illustrates a block scheme of an exemplary assembly 100 comprising a memory cell 100' that can be arranged in an array and then programmed and read according to the present disclosure.

In the embodiment illustrated in FIG. 1, the memory cell 100' includes a storage material 102 between access lines 104 and 106. The access lines 104, 106 electrically couple the memory cell 100' with circuitry 142 that writes to and reads from the memory cell 100'. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without using a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100' by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100' is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. The memory cell 100' may further include a selection device (not shown) between access lines 104 and 106; the selection device may be serially coupled to the storage material 102. In another embodiment, the storage material 102 is not a phase change material. In one embodiment in which the storage material 102 is not a phase change material, the storage material is capable of switching between two or more stable states without changing phase. The access circuitry 143 is able to program the memory cell 100' by applying a voltage with a particular polarity to cause the storage material 102 to be in the desired stable state.

In one such embodiment, programming the memory cell 100' causes the memory cell 100' to "threshold" or to undergo a "threshold event." When a memory cell thresholds (e.g., during a programming voltage pulse), the memory cell undergoes a physical change that causes the memory cell to exhibit a certain threshold voltage in response to the application of a subsequent voltage (e.g., a read voltage with a particular magnitude and polarity). Programming the memory cell 100' can therefore involve applying a voltage of a given polarity to induce a programming threshold event, which causes the memory cell 100' to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As it is explained in further detail below, the output of such a memory cell when read differs as a function of the polarity used to program the memory cell and the polarity used to read the memory cell. For example, the storage material 102 can exhibit a "lower threshold voltage" or a "higher threshold voltage" in response to a read voltage based on the polarity of both the programming and read voltages. In the context of the present disclosure, exhibiting a threshold voltage means that there is a voltage across the memory cell that is approximately equal to the threshold voltage in response to the application of a voltage with a particular magnitude and polarity to the terminals of the memory cell. The threshold voltage thus corresponds to the minimum voltage to be applied at the input(s) to produce output(s), i.e. to see a determined electrical response of the cell. In other words, in the context of the present disclosure, the verb "threshold" means that the cells undergo a threshold event, i.e. they have an electrical response in response to the applied voltage that is above a given threshold, thus exhibiting a peculiar threshold voltage.

As mentioned above, the access lines 104, 106 electrically couple the memory cell 100' with circuitry 142. The access lines 104, 106 can be referred to as a bitlines and wordlines, respectively. The wordline is for accessing a particular word in a memory array and the bitline is for accessing a particular bit in the word. In one embodiment, the access lines 104, 106 can be made of one or more suitable metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be made of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including RuO2, or other suitable conductive materials.

The stack made of electrodes 108 and storage material 102 is hereinafter referred to as the memory cell 100', without limiting the scope of the disclosure. In various embodiments, the memory cell 100' may comprise more or less elements. Therefore, the memory cell 100' is one example of a memory cell. Other embodiments can include memory cells having additional, less, or different layers of material than the ones illustrated in FIG. 1 (e.g., a thin dielectric material between the storage material and access lines and the like).

Referring again to the circuitry 142, the access lines 104, 106 communicatively couple the circuitry 142 to the memory cell 100', in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100'. The terms "write" and "program" are used interchangeably to describe the act of storing information in a memory cell. To write to the memory cell 100', the access circuitry applies a voltage pulse with a particular magnitude and polarity to the access lines 104, 106, which can both select memory cell 100' and program memory cell 100'.

For example, the access circuitry 143 applies a read voltage with one polarity to program the memory cell 100' to be in one logic state, and applies a pulse with a different polarity to program the memory cell 100' to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100' based on electrical responses to one or more of the voltage pulses in a read sequence.

The electric current generated upon application of a reading voltage thus depends on the threshold voltage of the memory cell determined by the electrical resistance of the logic state storage element. For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

Figure 2:
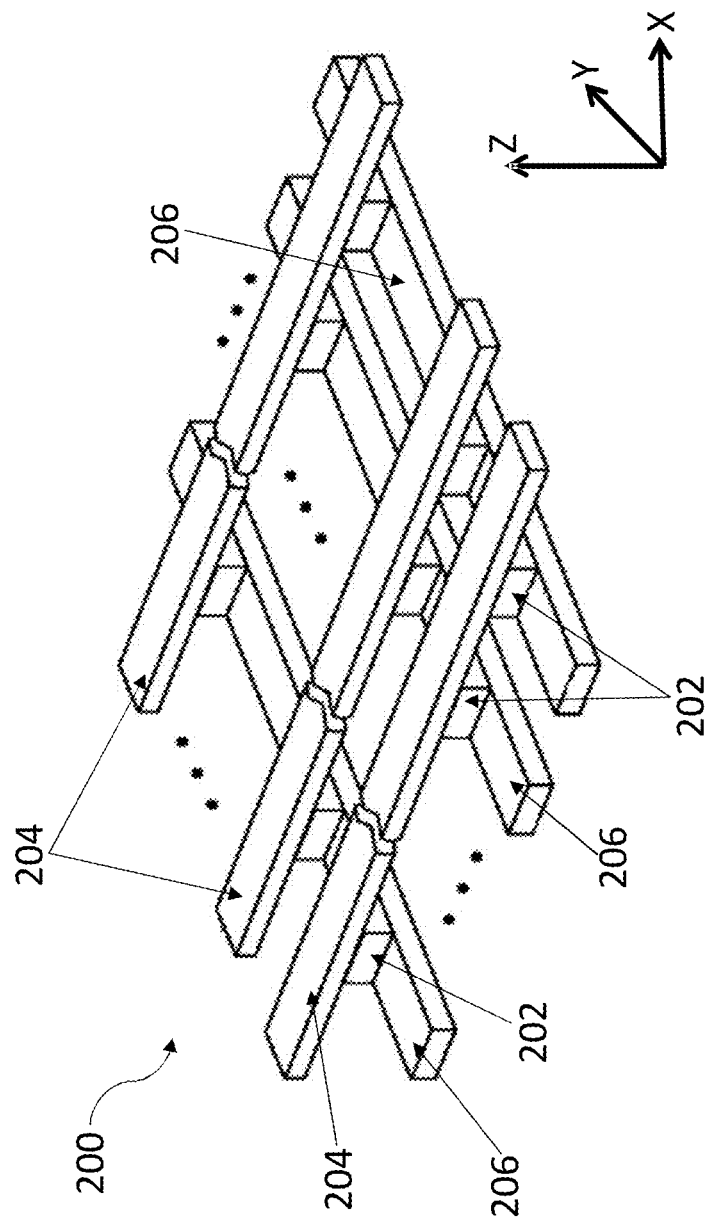
FIG. 2 schematically illustrates a portion of an exemplary memory cell array.

FIG. 2 shows a portion of a memory cell array 200, which can include a plurality of memory cells such as the memory cell 100' of FIG. 1, in accordance with an embodiment. The memory cell array 200 is an example of a three-dimensional cross-point memory structure (3D X Point). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. As disclosed in relation to FIG. 1, storage material 202 may be a self-selecting storage material, in some examples; storage material 202 may be serially coupled to a selection device (not shown), in other examples. In one embodiment, a "cross-point" is formed at an intersection between a bitline and a wordline. A memory cell is created from the storage material 202 between the bitline and wordline where the bitline and wordline intersect (it is noted that, in FIG. 2, additional layers such as electrodes are not shown, so that the cell is schematically represented in said figure by the storage material 202 only, without limiting the scope of the disclosure, and additional layers may be present). Generally speaking, the intersection defines the address of the memory cell. The storage material 202 can be a chalcogenide material such as the storage material 102 described above with respect to FIG. 1. In one embodiment, the access lines 204, 206 are made of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction).

A "cross-point" thus refers to a place where a memory cell is formed such that access lines associated with the memory cell topologically "cross" each other as access lines connect to different nodes of the memory cell. Cross-point architecture enables reaching the theoretical minimum cell area determined by the minimum pitch of access lines.

FIGS. 1 and 2 illustrate an example of a memory cell and array. However, other memory cell structures and arrays may be used, in which the memory cells exhibit electrical responses that vary as a function of programming and read polarity. A memory cell (not shown) may be formed at crossing locations between vertical conductive pillars, acting as bitlines, intersecting horizontal conductive planes, acting as wordlines, in a 3D memory array, for example. This and other array organizations may also lead to a cross-point architecture as described above.

Ideally, memory cells of a memory device should feature a same (nominal) resistivity and therefore a same threshold voltage for a same logic state, wherein the threshold voltage is the voltage to be applied to the memory cells for causing them to conduct an electric current, i.e. the minimum value of the voltage to create a conducting path between the terminals, as above defined. However, since different cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a cell, a reading operation is carried out to assess to which threshold voltage distribution the threshold voltage of the cell belongs. For example, a reading voltage may be applied to the cell via access lines and the logic state of the cell is assessed based on (the presence or absence of) a current responsive to said reading voltage, the (presence or absence of the) current depending on the threshold voltage of the cell. A cell thresholds (e.g., it becomes conductive) when a suitable voltage difference is applied between its two terminals; such a voltage difference may be obtained in different ways, for example biasing one terminal, such as a wordline terminal, to a negative voltage (e.g. a selection voltage), and the other terminal, such as a bitline terminal, to a positive voltage (e.g. a reading voltage). Other biasing configurations may produce the same effects (e.g., both the wordline and the bitline terminal biased to positive voltage, or the wordline terminal biased to a reference voltage, e.g. a ground voltage, and the bitline terminal biased to a positive voltage).

In other words, operations such as programming and reading, which may be referred to as access operations, may be performed on memory cells by activating or selecting a wordline 206 and bitline 204. As known in the field, wordlines 206 may also be known as row lines, sense lines, and access lines. Bitlines 204 may also be known as digitlines, column lines, data lines, as well as access lines. References to wordlines and bitlines, or their analogues, are interchangeable without loss of understanding or operation. For example, the access lines may be wordlines and the data lines may be bitlines. Wordlines 206 and bitlines 204 may be perpendicular (or nearly perpendicular) to one another to create an array, as previously shown with reference to FIG. 2. Depending on the type of memory cell (e.g., FeRAM, RRAM, etc.), other access lines (not shown in the figures) may be present, such as plate lines, for example. It should be appreciated that the exact operation of the memory device may be altered based on the type of memory cell and/or the specific access lines used in the memory device. Activating or selecting a wordline 206 or a bitline 204 may include applying a voltage to the respective line via a dedicated driver. By activating one wordline and one bitline, a single memory cell 202 may be accessed at their intersection. Accessing the memory cell may include reading or writing the memory cell.

Accessing memory cells may be controlled through a row decoder and a column decoder (not shown). For example, a row decoder may receive a row address from a memory controller and activate the appropriate wordline based on the received row address. Similarly, a column decoder may receive a column address from the memory controller and activate the appropriate bitline.

As mentioned before, in some cases, memory cells 202 may exhibit different electrical characteristics after a number of cycling operations (e.g., a series of read or write operations). For example, a threshold voltage of a memory cell 202 (e.g., PCM cell) corresponding to a logic state of 1, after receiving an identical programming pulse to store the logic state of 1 (e.g., a SET programming pulse), may be different if a memory cell is relatively new (e.g., a PCM cell with a small number of read or write operations) compared to a memory cell having been cycled through an extensive number of read or write operations. In addition, in some cases, a chalcogenide material in the memory cells (e.g., the logic storage element 102 or 202) may experience a change (which may also be referred to as a drift) in its resistance after programming (e.g., crystallizing or quenching) of the chalcogenide material during a write operation. Such change in resistance may result in changes in threshold voltages of memory cells and may hinder accurately reading information from memory cells (e.g., PCM cells) after a certain period of time elapsed. In some embodiments, the amount of change may be a function of ambient temperature. In many cases, it may be impractical to rely on error correction mechanisms to handle the errors.

The present disclosure provides a robust and reliable read technique also when memory cells (e.g., PCM cells or SSM cells) exhibit different, non-uniform, variable electrical characteristics that may originate from various factors including statistical process variations, cycling events (e.g., read or write operations on the memory cells), or a drift (e.g., a change in resistance of a chalcogenide alloy), among others. The voltage distributions of the cells may thus drift in time or exhibit shapes deviating from perfect statistical functions, e.g. deviating from a perfect gaussian curve.

More in particular, according to the read technique of the present disclosure, an auto-referenced reading of a set of user data (e.g., a codeword, a page) is performed based on data information previously stored in a codeword, said data information accounting for the statistical properties of the voltage distribution of the cells of the codeword, providing a new and more efficient solution for reading memory cells, in particular in 3D memory devices.

According to the present disclosure, the memory cells may be configured to store encoded user data that include modified user data (or original user data, in some cases) and a number of bits (e.g., flip-bits), which may be added thereto. In some cases, the encoded user data stored in the memory cells have been modified to include a certain number of bits having the logic state of 1. The number of bits having the logic state of 1 may vary within a predetermined range. As it will be disclosed in the following, the auto-referenced read of the present disclosure determines a proper read reference voltage to be applied to the memory cells, namely a voltage that is to be used to discern whether a memory cell exhibits a logic state of 1 (e.g., a SET status) or a logic state of 0 (e.g., a RESET status). The auto-referenced read may determine the read reference voltage for the memory cells by taking into account the statistical distributions of the bits programmed in the memory cells, e.g. of the bits of a codeword CW.

Figure 3:
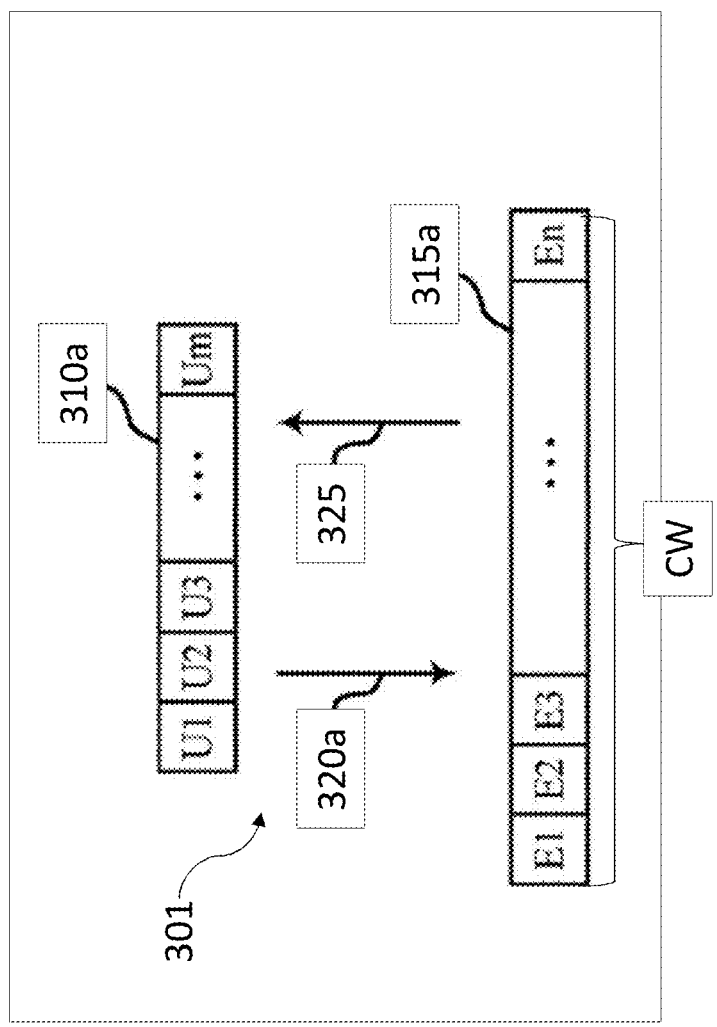
FIG. 3 illustrates an example of data pattern supporting a reading operation according to an embodiment of the present disclosure.

FIG. 3 illustrates an exemplary user data pattern diagram 301. The user data pattern diagram 301 includes user data 310*a* and encoded user data 315*a*. Encoding process 320*a*, which is performed in the programming phase of the array of memory cells, may convert the user data 310*a* into the encoded user data 315*a*. The encoded user data 315*a* may be stored in a set of memory cells, which may be, for example, memory cells 100' or 202 described with reference to FIGS. 1 and 2. Each box of the encoded user data 315*a* may correspond to a memory cell that may exhibit a logic state of 1 or a logic state of 0. During the encoding process 320*a*, a number of parity bits may be added to the user data 310*a* to establish a predetermined number of bits of the encoded user data 315*a* having a given logic value (e.g., a logic value of 1). As a result, a number of bits in the encoded user data 315*a* may be greater than the number of bits in the user data 310*a* (e.g., n is larger than m if some bits, e.g. parity bits, are added). Process 325 may convert the encoded user data 315*a* back to the user data 310*a* after the encoded user data 315*a* have been accurately read.

In an embodiment, the plurality of encoded bits to be read represents a codeword (CW). The codeword may be programmed to include various information to be used during the reading phase.

In some embodiments, for each set of user data 310*a*, corresponding encoded user data 315*a* may have a same number of memory cells exhibiting a logic state of 1 and a logic state of 0 (which may also be referred to as a balanced encoding scheme, where half of the encoded user data bits have a logic state of 1, and the other half have a logic state of 0). As such, the encoded user data may be referred to have a 50% weight. In some embodiments, for each user data 310*a*, corresponding encoded user data 315*a* may have a predetermined number of memory cells exhibiting a given logic state (e.g., a logic state of 1), hence producing a constant weight that may be different than 50% (which may also be referred to as a constant weight encoding scheme). In general, an outcome of the encoding process 320*a* may be that a predetermined number of memory cells exhibiting a given logic state (e.g., a logic state of 1) in the encoded user data 315*a* is established.

In other words, according to an embodiment of the present disclosure, the codeword may be manipulated to constrain the number of bits exhibiting a given logic state (e.g. a logic state of 1) to a known desired predetermined value, generally between a minimum value and a maximum value (e.g., between {Min1, Max1}, or within a range), by adding some extra bits of information. Therefore, in some embodiments, the memory cells of the array may be configured to store encoded user data that include modified user data (or original user data, in some cases) and a number of bits which may be added thereto, i.e. a data manipulation is performed to constrain the number of bits having a given logic state (e.g. the number of bits having the logic value 1) in a codeword by few (e.g. 2-4) parity or inversion bits. In this way, the statistics of the codeword is improved by using distributions having a reasonable number of bits in a given logic state, in particular having a predetermined number of bits having a logic state 1, or having a number of bits having a logic state of 1 in a given range, facilitating the reading operation and avoiding extreme cases with very few bits exhibiting the logic state 1. This also allows to statistically track usage (e.g. drift and cycling) of the codeword with few extra bits, as well as improving speed.

In some cases, the encoding scheme may result in the total number of bits in the encoded user data having a given logic state (e.g., a logic value of 1) being in a predetermined weight range (e.g., 48%-50%, 40%-48%, 40%-45%, or 20%-25%, for example) rather than an exact predetermined weight. Some additional bits may be programmed to obtain an exact weight, in some cases.

In the context of the present disclosure, a bit having the logic state of 1 (e.g. corresponding to a cell in the logic state 1) is identified as a bit in a first logic state, whereas a bit having the logic state of 0 (e.g. corresponding to a cell in the logic state 0) is identified as a bit in a second logic state, even if other definitions may be used. According to an embodiment of the present disclosure, the memory cells exhibit a threshold voltage with a lower magnitude when the memory cells are in the first logic state, and a threshold voltage with a higher magnitude when the memory cells are in the second logic state, the logic state of a given cell being determined based on whether the memory cell exhibits a higher or lower magnitude threshold voltage in response to an applied read voltage.

Summing up, the present disclosure thus provides, in the programming phase, the storage of user data (such as the encoded user data 315a) in a plurality of memory cells of the memory array, these data being subjected to encoding schemes as previously described. More in particular, when storing the user data, they may be encoded in a codeword having a predetermined number of bits exhibiting the first logic value. For example, in an embodiment, the encoded user data may have a same number of bits having the logic value of 1 and the logic value of 0, i.e. the encoded user data have substantially a same number of bits exhibiting the first logic state and the second logic state, even if other configurations in which the encoded user data have a known predetermined number of bits in the first logic value may be used. The present disclosure may thus include an encoding technique that ensures a certain number bits in the set of user data (e.g., a codeword of 128 bits) to have a given logic state (e.g., a logic state of 1) prior to storing the user data in memory cells (e.g., PCM cells, 3DXP memory cells). In some embodiments, a logic state of 1 (e.g., a SET state of cell, which may also be referred to as a SET cell or bit) corresponds to a set of threshold voltages lower than a set of threshold voltages associated with a logic state of 0 (e.g., a RESET state of a cell, which may also be referred to as a RESET cell or bit). The encoding technique may provide a number of bits having the logic state of 1 (e.g., the SET bits) within a certain range which may be established by a predetermined factor k. The ratio between a number of bits having the logic state of 1 (e.g., 32 SET bits) and a total number of bits in the user data (e.g., 128 bits) may be referred to as a weight (e.g., 25% weight) or a weight pattern. In some examples, the encoding technique may ensure the encoded user data to have a particular weight within a range of weights (e.g., between 50% and (50+50/k) %) established by the predetermined factor k. The larger the value of k, the narrower the range may become, which may result in an increased accuracy of the read operation. Further, the encoding technique may track changes in the user data during the encoding operation by storing k number of bits associated with the encoded user data. The k number of bits, which may also be referred to as flip-bits, may indicate a status of the original user data such that decoding of the encoded user data may be carried out accurately. In other words, the codeword may be encoded as wanted (e.g., to the desired number of bits having the logic state of 1) for improving read reliability or performance.

Figure 4:
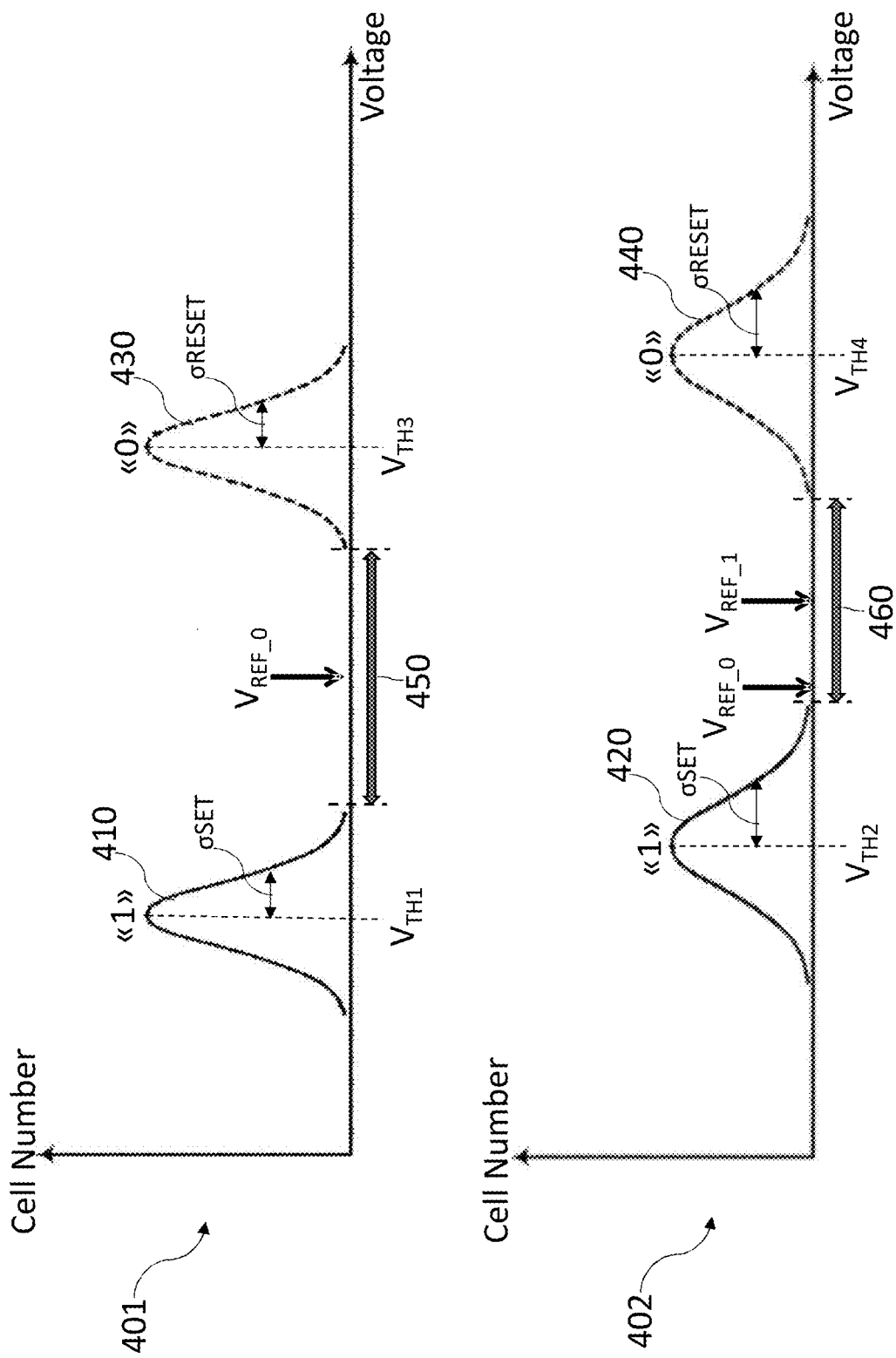
FIG. 4 schematically illustrates examples of threshold voltage distributions that support the reading operation according to embodiments of the present disclosure.

FIG. 4 illustrates examples of threshold voltage (VTH) distribution diagrams 401 and 402 of memory cells that supports read techniques in accordance with embodiments of the present disclosure. Each diagram 401 or 402 represents two groups of threshold voltages corresponding to two logic states (e.g., a logic state of 1, a logic state of 0) of the memory cells. The memory cells (e.g., PCM cells) may be embodiments of the memory cells 100' or 202 described with reference to FIGS. 1 and 2. The logic state of 1 may correspond to a first set of threshold voltages (e.g., a distribution 410, a distribution 420) of the memory cells. In some cases, the logic state of 1 is referred to as a SET state of a PCM cell. The logic state of 0 may correspond to a second set of threshold voltages (e.g., a distribution 430, a distribution 440) of the memory cells. In some cases, the logic state of 0 is referred to as a RESET state of a cell.

Distribution diagram 401 depicts a number of memory cells (y-axis) as a function of threshold voltages VTH (x-axis) of the memory cells. The memory cells of the distribution diagram 401 may represent a set of memory cells storing encoded user data in accordance with the encoding scheme of the present disclosure, as mentioned above. In other words, the encoded user data has a number of bits having the logic state of 1 (e.g., SET cells) within a predetermined range. The distribution 410 illustrates a threshold voltage VTH distribution of memory cells programmed to the logic state of 1. The distribution 430 illustrates a threshold voltage VTH distribution of memory cells having the logic state of 0. The distribution 410 may have a median value (or peak value) denoted as VTH1. A standard deviation (e.g., σSET) of the distribution 410 determines the width of said distribution 410. Similarly, the distribution 430 may have a median value denoted as VTH3 and a standard deviation (e.g., σRESET) that determines the width of said distribution 430. The distributions may be gaussian distributions or other statistical functions depending on various factors.

In some embodiments, each distribution may not be symmetrical around its median threshold voltage VTH, as shown below. In some embodiments, each distribution may exhibit a different ranges of threshold voltage VTH values (not shown).

A difference between the highest threshold voltage of the memory cells having the logic state of 1 and the lowest threshold voltage of the memory cells having the logic state of 0 is referred to as a read window budget 450. A desired read reference voltage may be determined to be at or near the middle of the read window budget 450 and is denoted by VREF_0 in FIG. 4. The threshold voltage VTH distributions diagram 401 may illustrate voltage distributions of a set of memory cells that are relatively new (e.g., PCM cells with a small number of cycling operations) or recently programmed (e.g., memory cells without a significant drift).

Similarly, threshold voltage VTH distributions diagram 402 depicts a number of memory cells (y-axis) as a function of threshold voltages (x-axis) of the memory cells. The distributions diagram 402 may illustrate distributions of the encoded user data (e.g., the encoded user data represented by the distribution diagram 401) stored in a set of memory cells that may have experienced an extensive number of cycling operations representing a different electrical characteristic. The distribution 420 illustrates a threshold voltage VTH distribution of memory cells having the logic state of 1. The distribution 440 illustrates a threshold voltage VTH distribution of memory cells having the logic state of 0. The distribution 420 may have a median value denoted as VTH2 that may be greater than VTH1. The distribution 440 may have a median value denoted as VTH4 that may be greater than VTH3, i.e. peak value may drift. A $\sigma$SET of the distribution 420 may be greater than the $\sigma$SET of the distribution 410. A $\sigma$RESET of the distribution 440 may be greater than the $\sigma$RESET of the distribution 430, i.e. distributions may be larger. As a result, a read window budget 460 of the threshold voltage distributions diagram 402 may be different (e.g., less) than the read window budget 450 of the threshold voltage distributions diagram 401. Therefore, the read reference voltage VREF_0 for the distributions diagram 401 may not be appropriate for the distributions diagram 402. A new desired read reference voltage VREF_1 may be configured to support accurate reading of the memory cells of the distributions diagram 402. The change in the read window budget and the associated change in the read reference voltage, as well as the change in the shape of distributions, may be a result of memory cells experiencing extensive cycling operations and/or significant drift events, and the present disclosure provides methods and systems to perform an efficient reading operation of these cells.

The use of fixed, defined a priori, reference read voltages VREF may result in read disturb, for instance when the value of a reference voltage used for reading cells in the first logic state 1 is close to the minimum threshold voltage of the cells in the second logic state 0, so that reading may be negatively affected.

The reading of the codeword may be improved according to the present disclosure. More in particular, the present disclosure relies on encoding and programming schemes that provide the storage, for each single codeword, of distribution information enabling the proper setting of the reference voltage, and allowing an accurate subsequent reading of the user data regardless of the different electrical characteristics of memory cells, and thus regardless of possible different voltage distributions of the cells of different codewords.

First of all, according to the present disclosure, a set of user data is stored in a plurality of memory cells of the memory array. As previously mentioned, the user data are generally encoded in a codeword having a number of bits exhibiting the first logic state in a range, the encoding step comprising manipulating the codeword to constrain the number of bits exhibiting the first logic value in the range. In an embodiment, the encoded user data have substantially a same number of bits exhibiting the first logic state and the second logic state.

In an embodiment of a programming method of the present disclosure, the cells are initially programmed to the first logic state 1 (i.e. a programming voltage is initially applied to switch the array cells to All1), even if the present disclosure is not limited thereto and another suitable configuration may be adopted.

When programming the array of memory cells, a predetermined number of memory cells of the array, hereinafter referred to as "trigger memory cells T", is used to detect the switching of a predetermined number of cells having a given logic state, i.e. the logic state of 1.

More in particular, a programming voltage for programming cells to a first logic state is applied to the memory cells of the array. When it is determined that a predetermined first group of memory cells, i.e. the above mentioned trigger memory cells T, has been switched to an active state based on the application of the programming voltage, this programming voltage corresponding to the activation of said cells (herein referred to as "first threshold voltage") is stored into a portion of the memory array. The first threshold voltage is thus the programming voltage used to activate the preset number of trigger memory cells T in the first logic state, e.g. in the logic state 1.

In other words, a number T of cells acts as trigger and, once said T (or T−1) trigger cells are switched based on the application of the programming voltage, the desired predetermined number of memory cells is thus activated and the corresponding programming voltage (i.e. the first threshold voltage) is stored. As mentioned above, in an embodiment, T−1 cells are considered in order to avoid a possible fail-cell inside trigger to produce an error.

In an embodiment, the trigger memory cells T are used to store the intrinsic switching value of the voltage distribution of a set of memory cells programmed to the first logic state. More particularly, in an embodiment, the first threshold voltage is the median—i.e. the peak-threshold voltage value of the memory cells in the first logic state, allowing tracking the intrinsic of the distribution without being affected by very slow switching or defects or cells broken with device life. The median threshold voltage may thus be determined based on the activation of the predetermined number of trigger memory cells T in the first logic state, i.e. the logic state of 1.

According to other embodiments of the present disclosure, any point of the cell voltage distribution may be identified and tracked as a reference point, i.e. the first threshold voltage may be a particular threshold voltage value for the cells programmed to the first logic state and it is not necessarily the peak value (i.e. it may be comprised between the minimum expected threshold voltage value and the peak value, or may be greater than the peak value), depending on the circumstances. The present disclosure thus allows a choice of a reference tracking point of the distribution, optimizing the trade-off between reading speed and accuracy, depending on the circumstances.

The applied programming voltage may thus initiate a series of switching events by activating the first group of memory cells, i.e. the trigger memory cells T, and thus programming them to the first logic state 1. In other words, the present disclosure identifies that a particular switching event (e.g., a T-th switching event of the plurality of switching events) correlates to a given threshold voltage value (e.g. a median—or peak—threshold voltage, or other desired values of the distribution) of memory cells having the logic state of 1 (e.g., SET cells) and the corresponding voltage is stored.

Figure 5A:
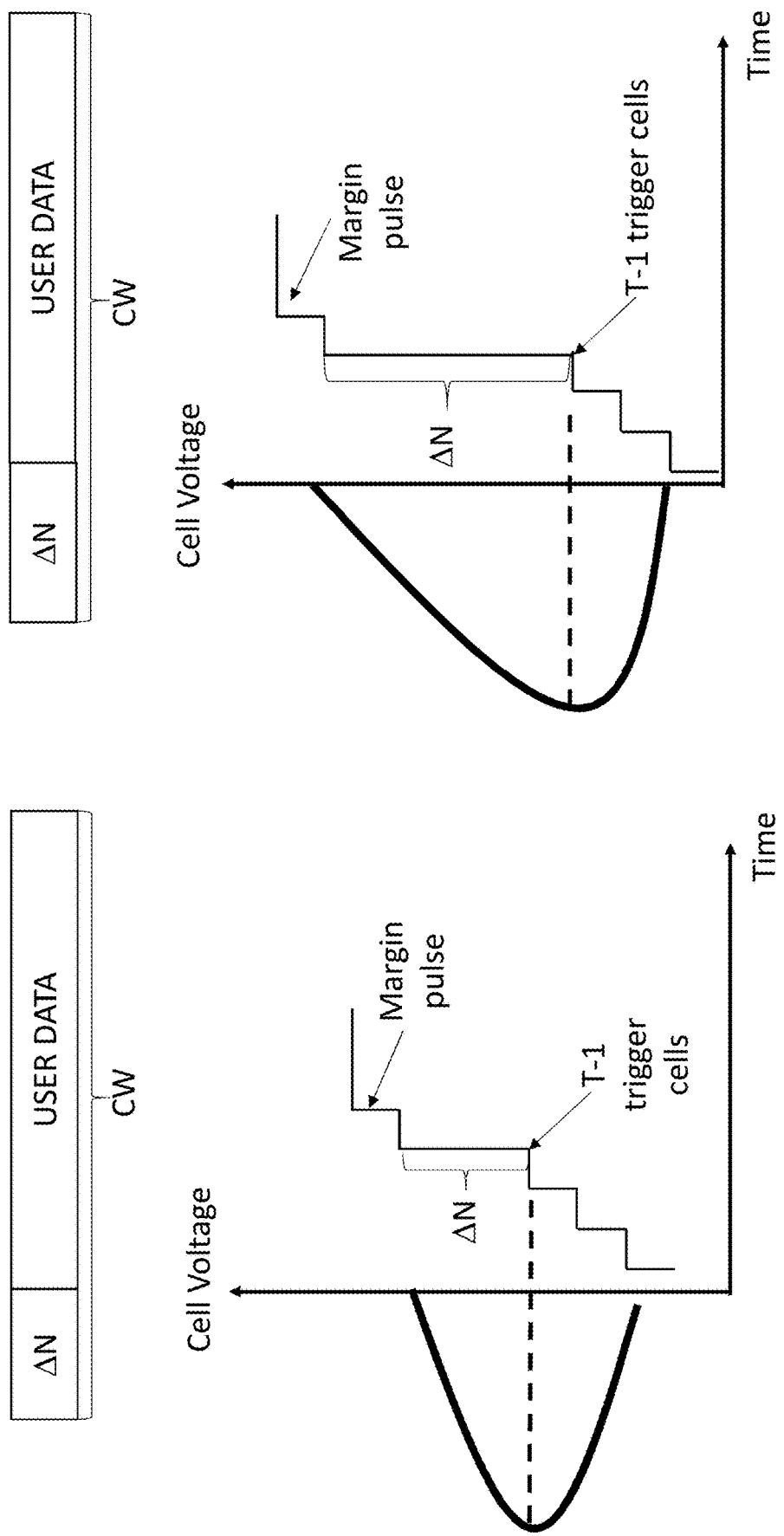
FIGS. 5A and 5B schematically illustrate threshold voltage distributions of memory cells programmed to a logic state, as well as the corresponding read voltages according to embodiments of the present disclosure.
Figure 5B:
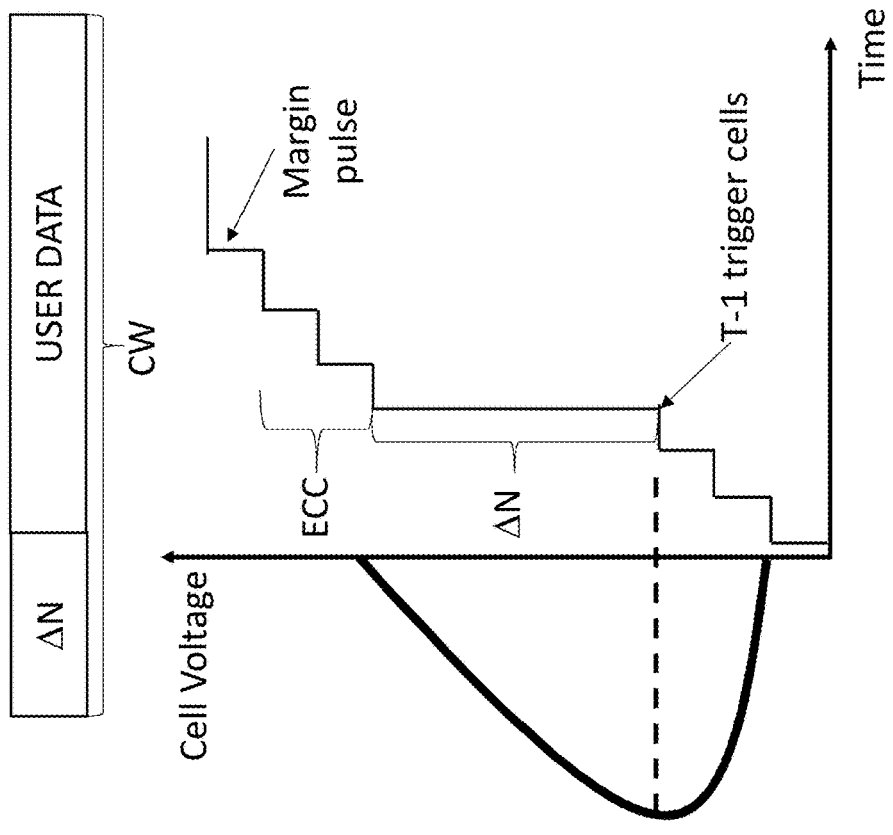
Figure 5B:
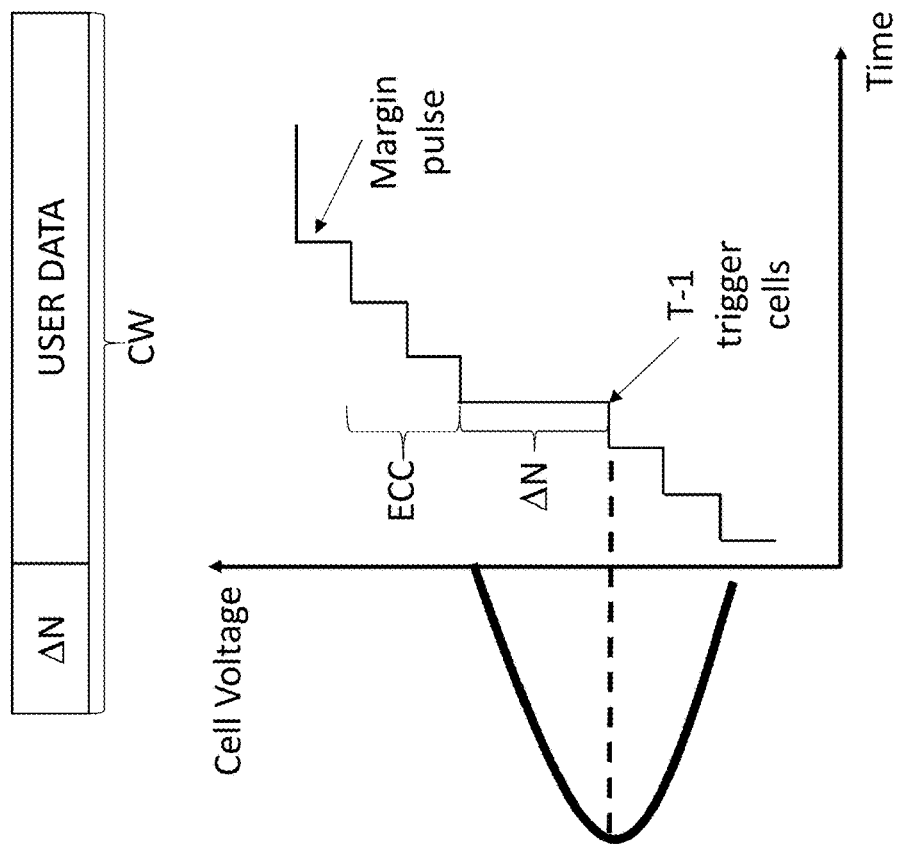

After detecting the T-th switching event, corresponding to the activation of the trigger memory cells T, the expected extreme (e.g. maximum) threshold voltage value of the voltage distribution of the memory cells is precisely calculated each time a codeword is programmed into said cells, as each codeword may have its specific distribution, as shown in FIGS. 5A and 5B which illustrate the voltage distributions relating to two different codewords of the memory array. Advantageously, once the voltage used to activate the first group of memory cells is stored, a proper voltage ΔN, which is calculated and defined for each codeword, is stored and associated to the codeword to be subsequently applied to the memory cells.

More in particular, the present disclosure provides the storage, for each codeword of the memory array, of additional data information, said additional data information being representative of a voltage difference ΔN between the first threshold voltage (i.e. the voltage to activate the preset number of trigger memory cells T programmed to the first logic state) and a second threshold voltage used to program the remaining cells of the array, said second threshold voltage depending on the actual width of the threshold voltage distribution, which may be different from codeword to codeword.

In other words, the second threshold voltage is a programming voltage used to activate the memory cells in the first logic state and whose magnitude is higher than the first threshold voltage, more specifically the second threshold voltage corresponds to the expected maximum threshold voltage of the voltage distribution of the memory cells programmed at the first logic state 1, and is based on the actual statistics of the threshold voltage distribution. As shown in the exemplary embodiments of FIGS. 5A and 5B, the value of ΔN may be a voltage difference between the peak of the voltage distribution (or generally a given value of the distribution) and the maximum expected threshold voltage value, and accounts for the actual width of the voltage distribution of the set of user data.

According to an embodiment of the present disclosure, the calculation of ΔN is based on the difference between the last voltage value (e.g. the last voltage step in case of a staircase ramp) used to program the array and the first threshold voltage (i.e. the trigger switching voltage step), and is stored into some bits related to the codeword.

More in particular, according to an embodiment of the present disclosure, in the programming operation, the user data are encoded according to an Error Correction Code (ECC) scheme.

In an embodiment, during the application of the programming voltage (e.g. during incrementing voltage with a voltage ramp), all the cells are programmed at 1.

As previously mentioned, once it is determined that the predetermined first group of memory cells has been switched to an active state based on the application of the programming voltage (i.e. after switching of the codeword trigger memory cells T used to detect the switching of the predetermined "1's"), information representative of the corresponding programming voltage value (e.g. the corresponding voltage step value) is stored.

An ECC verify operation is then performed on the programmed data and the value of the syndrome of said ECC is determined. More in particular, after the trigger memory cells T are switched, the ECC is operated simultaneously to the application of the programming voltage to program the remaining cells of the array.

The ECC has the ability to correct data bit errors which occur in memory arrays. ECC syndrome bits are the XOR of computed check bits and read check bits. Non-zero ECC syndrome bits denote an error, while a zero ECC syndrome denotes a correct programming operation.

Figure 6:
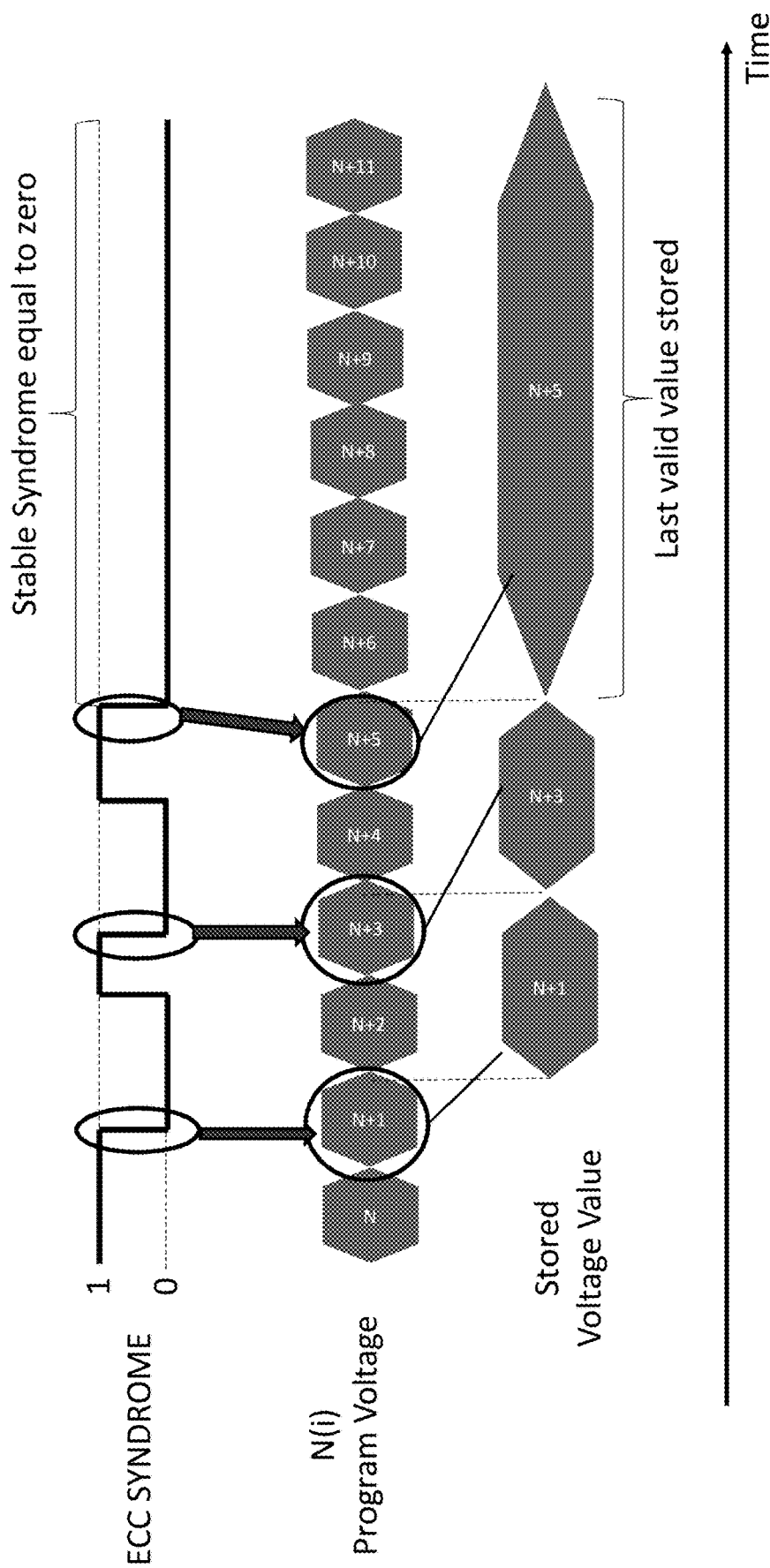
FIG. 6 is an exemplary scheme illustrating a technique for storing a programming voltage according to an embodiment of the present disclosure.

According to the present disclosure, as schematically illustrated in FIG. 6, based on the ECC syndrome calculation, the programming voltage values corresponding to an ECC syndrome toggling from a first value (e.g. from 1) to a second value (e.g. to 0, corresponding to a correct programming operation as in steps N+1, N+3 and N+5 of the example of FIG. 6) are stored, while the programming voltage values corresponding to an ECC syndrome different from the second value (i.e. different from 0) are ignored (in the example N and N+2). The voltage difference between the programming voltage used to program the first group of trigger memory cells T (i.e. the first threshold voltage) and the last programming voltage value used to program the memory cells to the first logic state 1 and resulting in a stable ECC syndrome equal to zero (i.e. the second threshold voltage causing the last toggling from the first value of 1 to the second value of 0) is then stored in a portion of the memory array. The second threshold voltage is thus the programming voltage corresponding to the activation of all the cells in the first logic state, i.e. in the logic state 1, within the ECC correction capability. In other words, in the programming phase, the memory cells are programmed at 1 with a program and verify "on the fly", up to a stable ECC output (corresponding to a zero syndrome).

In an embodiment, the programming voltage may be a voltage staircase up to the maximum threshold voltage value, in case plus a margin voltage.

Figure 7:
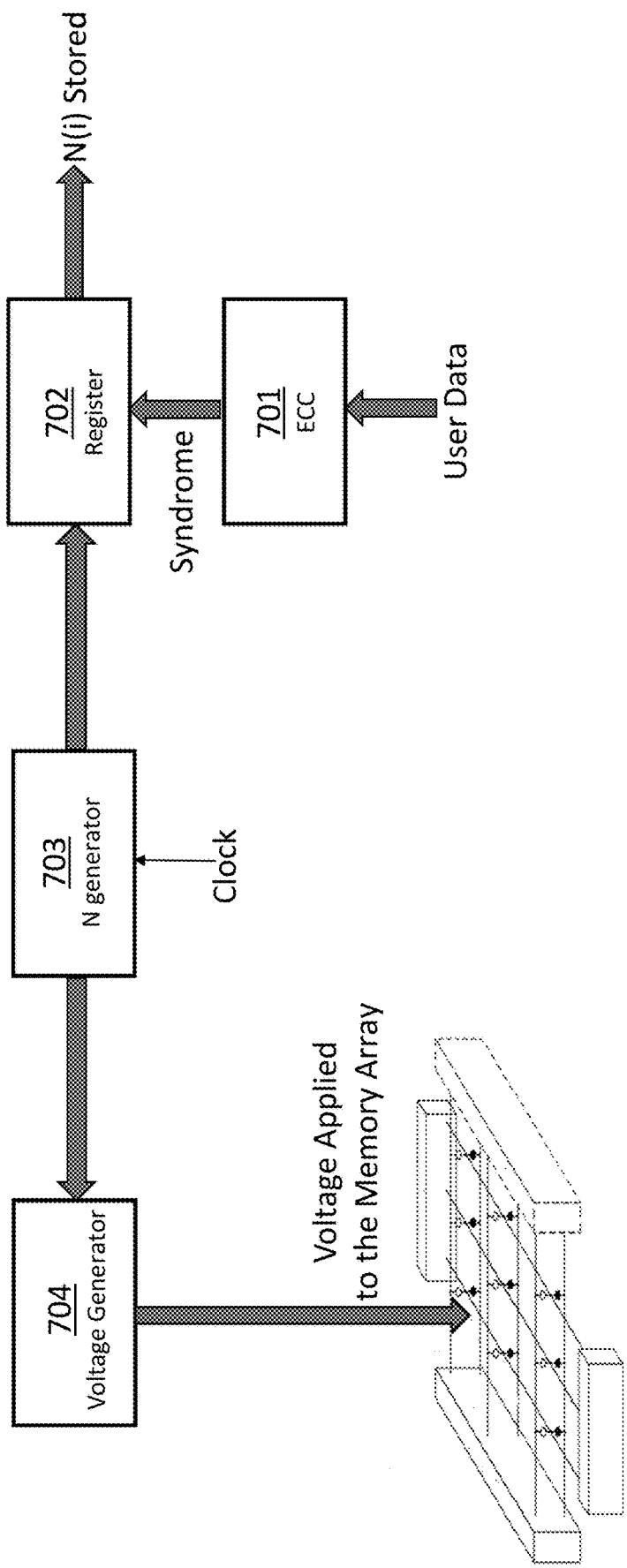
FIG. 7 is a block diagram illustrating an architecture for storing a programming voltage according to an embodiment of the present disclosure.

In this way, during the application of the programming voltage (which may be a voltage staircase ramp comprising N steps), anytime the syndrome is zero, the staircase up step N(i) is stored into a latch or a register (as schematically shown in FIG. 7), while, when the syndrome is 1, the corresponding N(i) voltage value is ignored. The syndrome will toggle between 1 and 0 across the whole staircase up until it is stabilizing to zero, indicating that all the cells have been properly programmed to the first logic state 1 within the ECC correction capability, and the corresponding N(i) voltage step value is then stored.

More in particular, in an embodiment shown in FIG. 7, the programming technique of the present disclosure may be executed by an ECC calculation unit 701 configured to produce, from the encoded set of user data, a syndrome value, and, when the syndrome value is zero, the corresponding programming voltage value (e.g. the N(i) voltage step) is stored in a register and/or latch 702 while, when the syndrome is different from zero, the corresponding programming voltage is ignored. The programming voltage is updated in said register or latch 702 anytime the ECC syndrome is toggling from a value different from zero to zero. A logic circuit 703 is configured to generate the N voltage steps value that are used by a voltage generator 704 to apply the proper voltage to the array.

Therefore, at any new zero of the ECC syndrome, the equivalent N(i) voltage value is stored, updating into the register its last value. The last stored value is equivalent to the staircase up step at which the distribution is written to All1 within the ECC correction capability. In fact, the syndrome is stable at 0 when the data pattern is correctable by the ECC, which means that all the memory cells are programmed to the logic state 1 except for at most its correcting power. In other words, the second threshold voltage is the last programming voltage corresponding to a switching of the ECC syndrome to 0 and, when saved, updates the previous stored programming voltages. A verify process based on ECC feedback is thus used during the programming phase to retrieve information about the distribution width by waiting for the last used voltage value. The last used voltage value is updated to the current step of the voltage staircase if ECC syndrome is toggling from 1 to 0; in other words, anytime the ECC syndrome is toggling from a value different from zero to zero, the corresponding programming voltage value is stored updating the previous value thereof.

Advantageously, this technique takes into account also cells with very high switch voltage or defective cells (e.g. stuck at 0).

In other words, a programming write operation is herein disclosed which firstly writes the memory cells of the array to All1 and then measures the distribution width and stores the measured distribution information in the form of the voltage $\Delta N$ into the codeword CW.

In an embodiment, once the cells have been programmed to the first logic state 1 and $\Delta N$ has been stored in the codeword, a programming write operation writes-back cells in the second logic state 0. In general, if there are 0's to be written, write-back of the user data is performed by changing the decoder polarity. In other words, after the programming of the cells to the first logic state 1, the present disclosure provides for a write-back operation for programming memory cells of the array to the second logic state 0. According to an embodiment of the present disclosure, the cells that have to be programmed to the second logic state are initially masked in such a way that, during the application of the programming voltage for programming the cells to the first logic state, said masked cells are regarded as memory cells already programmed to said second logic state, so as not to affect the operation of the ECC during the programming operation of the cells in the first logic state.

At the end of the programming operation, drift is reset and also reset disturb is reset because write back to 0 is applied.

The stored information representative of voltage difference ($\Delta N$) is then used as additional data information for properly reading the codewords of the array. Specifically, a particular $\Delta N$ value is adapted and stored for each particular codeword, improving the reading operation by adding to a read voltage said voltage difference $\Delta N$, as disclosed in the following, said $\Delta N$ being read before reading the data of the codeword. The present disclosure thus provides for an advantageous programming method and a corresponding reading method of an array of memory cells, and therefore provides for an improved access operation to the array of memory cells.

In order to read user data, a read voltage is applied to the memory array, said voltage being configured to activate a group of memory cells containing the encoded user data. In some embodiments, the read voltage has a constant rate of increase with respect to time. In other embodiments, the read voltage has a monotonically increasing staircase shape such that a first step is applied for a first period of time followed by a second (possibly different) step for a second period of time.

In a preferred and non-limiting embodiment of the present disclosure, the read voltage is a staircase voltage ramp comprising N steps, as shown in FIGS. 5A and 5B.

The applied read voltage initiates a series of switching events by activating the first group of memory cells storing the encoded user data, i.e. activating the above-described trigger memory cells T. The switching event may be attributed to a memory cell turning on ("activating"), e.g., conducting an appreciable amount of current, when the applied voltage across the memory cell exceeds its threshold voltage VTH. Hence, initiating the series of switching events in response to the increasing read voltage may be similar to identifying memory cells in an ascending order in terms of their threshold voltage values.

Referring again to FIGS. 5A and 5B, the present disclosure identifies that a particular switching event (e.g., a Tth switching event of the plurality of swathing events) correlates to a given threshold voltage value (e.g., a median—or peak—threshold voltage) of memory cells having the logic state of 1 (e.g., SET cells). In an embodiment, the memory cells that have been activated, including the memory cell that exhibited the Tth switching event, may be determined to have the logic state of 1 (e.g., SET cells).

In some embodiments, the present disclosure identifies a memory cell having a VTH value close to the median VTH value (e.g., VTH1 of distribution 410, VTH2 of distribution 420 of FIG. 4), or, in other embodiments, close to other different voltage values. The read operation may determine such memory cell (e.g., a memory cell having a T-th threshold voltage value in ascending order) based on a knowledge that encoded user data has a number of bits having the logic state of 1 (e.g., SET cells) within a predetermined range. The read operation may apply a read voltage (e.g., an activation voltage) to the memory cells in order to detect the memory cell turning on (e.g., the memory cell exhibiting the T-th switching event) while the read voltage amplitude increases with respect to time.

The read of the array is thus performed by applying to the memory array a read voltage to activate the first group of memory cells corresponding to the preset number of trigger memory cells T, and then determining that said first group of memory cells has been activated based on applying the read voltage, wherein said read voltage is equal to the first threshold voltage when the first group of memory cells has been activated.

After detecting the T-th switching event, corresponding to the above-mentioned activation of the trigger memory cells T, it would be desirable to apply a read voltage (i.e. a read pulse) accounting for the correct statistical distribution of the threshold voltages of the memory cells, avoiding the application of a preset fixed read voltage, as instead performed in the prior art solutions not accounting for different distributions of different codewords in the memory array.

Advantageously according to the present disclosure, once a read voltage is applied to the memory array to activate the first group of memory cells (i.e. after the application of the first threshold voltage), the voltage difference $\Delta N$, representing a proper voltage step defined for each codeword and calculated as above, is applied to the memory cells to complete the reading operation. The present disclosure may thus provide a proper read technique for the memory cells, e.g. also for both situations 401 and 402 of FIG. 4.

Therefore, depending on the voltage difference $\Delta N$ stored into the codeword, a voltage step offset equal to $\Delta N$ is applied to the array to complete reading after the application of the first threshold voltage.

More in particular, the present disclosure provides, based on the stored additional data information (which are read from the codeword before reading the user data in said codeword), the application of the voltage difference $\Delta N$ to the memory array to activate a second group of memory cells programmed to the first logic state, i.e. to the logic state 1. The second group of activated memory cells corresponds to the cells having a threshold voltage whose magnitude is comprised between the first threshold voltage and the maximum expected threshold voltage of the cells in the first logic state 1.

Advantageously, the voltage $\Delta N$ is specific for each codeword and is associated to each particular codeword so that the value thereof may be properly used during the reading operation. In this way, the voltage ΔN corresponds to a voltage used to properly read all the cells in the first logic state (e.g. up to 5σ from the intrinsic value of the distribution, i.e. up to the last statistically significant value within the ECC correction capability, said value being different for each codeword), without affecting the cells programmed in the second logic state, thus eliminating read disturb.

According to an embodiment of the present disclosure, an additional margin read voltage may be applied after the application of the voltage difference ΔN, e.g. in order to account for voltage threshold distributions enlarging with time.

In this case, a corresponding margin may be taken while storing the last programming voltage value (for example, if the program value is a staircase voltage ramp and N is the last step, the saved value is N−1). This allows to not consider a possible very high threshold cell and decide with the ECC if continue or not.

Since the last programming voltage has reset the drift and the reset disturb (the distribution window is quite enlarged) and it has written the used ΔN to program the cells at 1 into the ECC correction capability, the extra margin pulses may account for distribution enlarging with time (e.g. a standard deviation increasing from 95 mV to 140 mV max). This means that a value of 6σ corresponds to less than 300 mV, which is comparable with a pulse step. A single pulse can thus be accounted for the tail bits. This single pulse amplitude is then subtracted by the total available window (which has been enlarged because of the per-page reading and the program strategy which is avoiding the reset read disturb).

According to another embodiment of the present disclosure, as shown in FIG. 5B, an ECC verify operation is performed after the application of the voltage difference ΔN; in this case, a further read voltage (e.g. one or more voltage steps) is applied in case the ECC verify operation yields an error to be corrected in the set of user data. In other words, a Try and Repeat ECC verify is started until the errors are corrected.

Moreover, according to an embodiment of the present disclosure, the additional data information ΔN comprises bits protected using an ECC and/or a differential cells scheme. For example, ΔN may comprise 3 bits (and 3 parity bits), resulting in 12 bits differential and protected by ECC1.

According to an embodiment of the present disclosure, ECC is checked at each new read pulse.

According to the present disclosure, the read operation is thus based on switching the array cells to All1. The applied read voltage is firstly based on a predetermined number of trigger memory cells T and then an additional pulse step (i.e. the voltage difference ΔN) based on the additional information stored into the codeword CW during the write phase. In other words, the voltage spread ΔN is measured starting from a predefined distribution point (in an embodiment, the number T of cells read as 1 in an A111 distribution, limited to cells that are going not to be programmed to 0) and during the read operation the T-th switching event may be dynamically determined (therefore compensating for any drift) and ΔN applied.

The remaining memory cells of the encoded user data (e.g., the inactive memory cells after the application of the read voltage) may be determined to be the memory cells having the logic state of 0 (e.g., RESET cells).

In an embodiment, cells are programmed back to 1 (and then to 0). However, in other embodiments, such as embodiments comprising vertical 3D memories, a read only command may be allowed.

The techniques disclosed herein have several advantages, since the reading operation does not use a counter and relies just on the trigger memory cells T tracking a point of the distribution and on the stored information ΔN from the last write operation to track the width of the distribution. The operation is fast since the total number of steps is almost divided by two.

Advantageously, the disclosed reading operation allows tracking the distribution tails and reset the drift and reset disturb. The voltage represented by ΔN corresponds to a voltage to read the cells in the first logic state (e.g. up to 5σ from the intrinsic value of the distribution, i.e. up to the last statistically significant value within the ECC correction capability). The voltage (e.g., σN) is adaptive to codeword and its usage, it has not to be decided at probe: the larger the distribution width, the larger is σN. It is also observed that, in case of large distributions, the greater read reference voltage resulting from a greater ΔN will not affect the bits programmed with opposite polarity, as the probability of having a bit programmed with opposite polarity close to said reference voltage is extremely low (as the result of a product of probabilities), within the ECC correction capability.

Advantageously, each codeword stored in the memory array comprises respective additional data information associated thereto.

Figure 8:
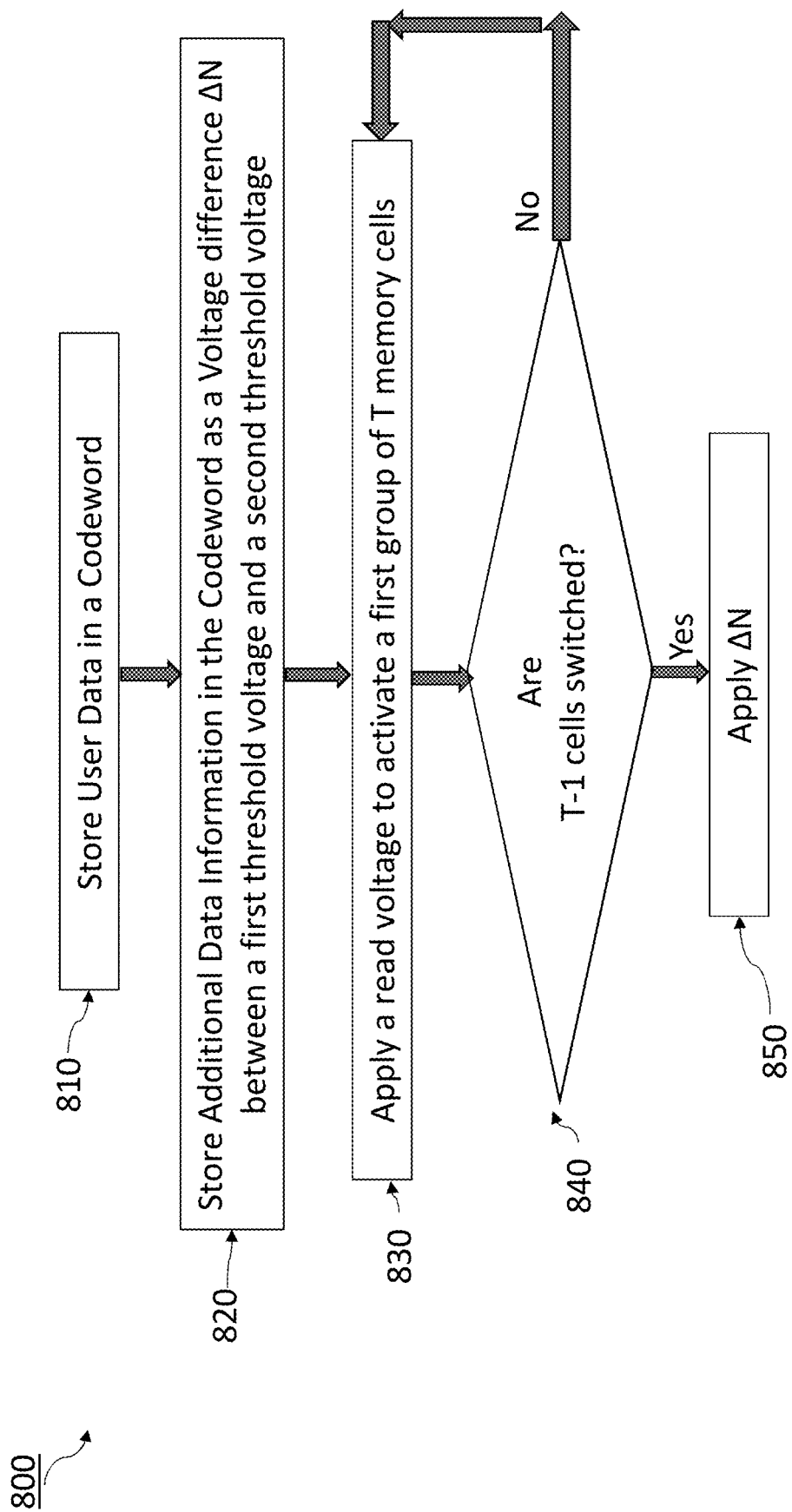
FIG. 8 is a flow diagram representing steps of a method for reading an array of memory cells according to the present disclosure.

FIG. 8 is a flow chart representing steps of a method 800 for accessing memory cells according to the present disclosure. The processes described can be performed by hardware logic and circuitry. For example, the following processes are described as being performed by access circuitry and sense circuitry, as disclosed herein. However, other embodiments can include different circuitry configurations suitable for performing the processes.

The method of the present disclosure is a method for improving read operations of memory cells. Prior to reading the memory cells, access circuitry writes data to a plurality of memory cells. For example, access circuitry writes logic 0s and logic 1s to a plurality of memory cells such as the memory cell 100' of FIG. 1. In one embodiment, access circuitry can write logic 0s by applying programming pulses with a negative polarity and logic 1s by applying programming pulses with a positive polarity. The opposite convention can also be adopted. After writing data to the plurality of memory cells, access circuitry can read the plurality of memory cells using the read sequence of the present disclosure.

More in particular, at step 810, user data are stored in a plurality of memory cells of a memory array, e.g. are stored in a codeword.

At step 820, additional data information ΔN are stored in a portion of the memory array, the additional data information representative of a voltage difference between a first threshold voltage and a second threshold voltage of the memory cells of the set of user data programmed to a first logic state, wherein the first threshold voltage is a voltage to activate a preset number of memory cells programmed to the first logic state, and wherein the second threshold voltage is a voltage to activate memory cells programmed to the first logic state having a threshold voltage whose magnitude is higher than the first threshold voltage and is based on the statistical distribution of the threshold voltages of the memory cells of said set of user data.

A further step, not shown, provides for reading the additional data information σN stored in the codeword to use them to perform the data reading operation.

At step 830, a read voltage is applied to activate a first group of memory cells corresponding to the preset number of memory cells. At step 840 it is determined that the first group of memory cells has been activated based on applying the read voltage. In other words, based on the application of the read voltage, it is determined if the trigger memory cells have been activated.

In case said trigger memory cells T have been activated, the voltage difference represented by ΔN is applied at step 850 to the memory array to activate a second group of memory cells programmed to the first logic state, therefore properly reading all the cells programmed to the first logic state.

Figure 9A:
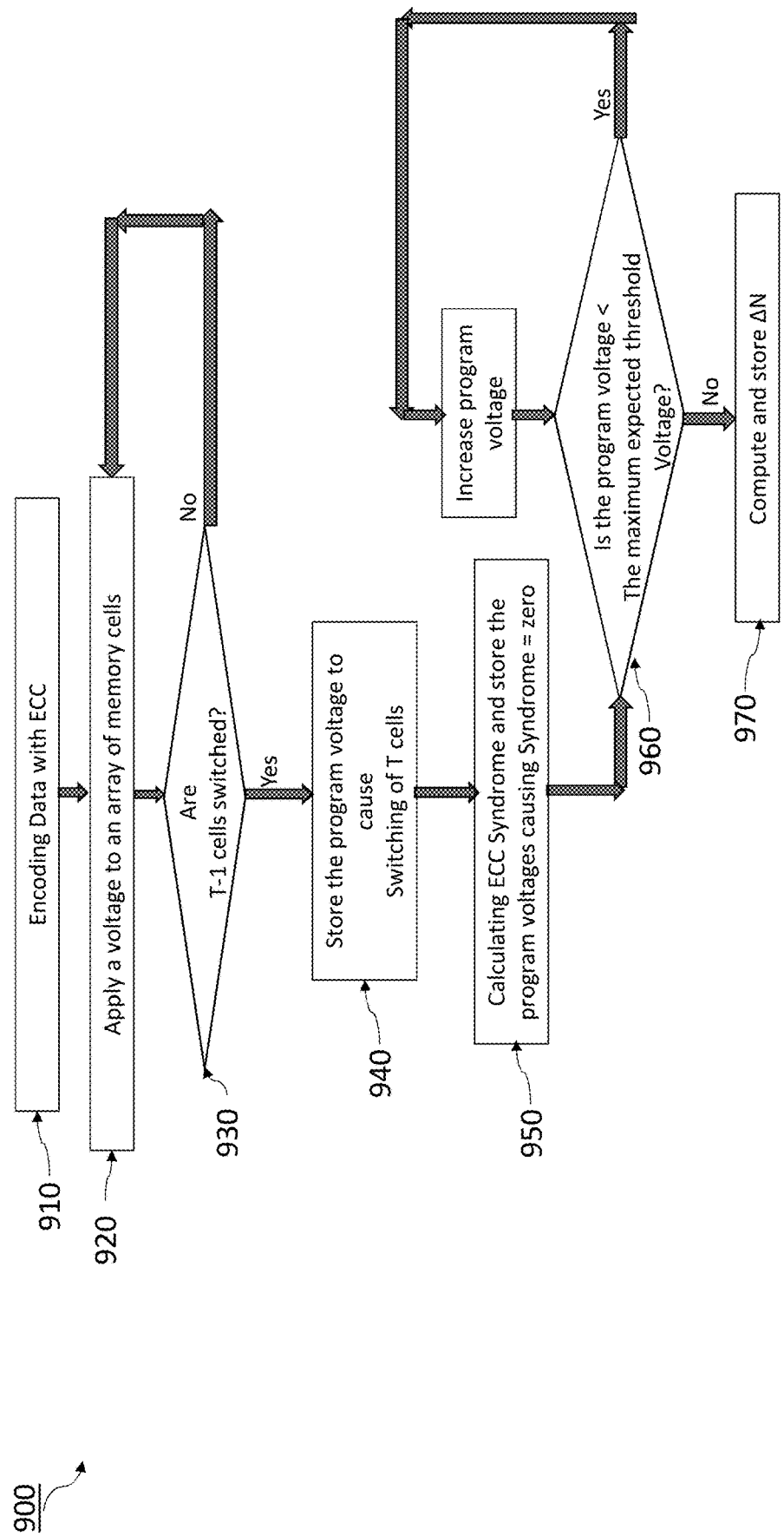
FIGS. 9A and 9B are flow diagrams representing respective steps of a method for programming an array of memory cells according to the present disclosure.

FIG. 9A illustrates steps of a method for programming an array of memory cells. At step 910, user data are encoded according to an Error Correction Code (ECC) scheme. A programming voltage is applied for programming to a first logic state the memory cells of the array, as in step 920 (e.g. voltage is incremented following a staircase voltage ramp or the like). At step 930, it is determined that a predetermined first group of memory cells has been switched to an active state based on the application of the programming voltage. In particular, when it is determined that all the trigger memory cells T have been activated, the programming voltage, i.e. the first threshold voltage, corresponding to the switching to the active state of all said cells is stored.

Figure 9B:
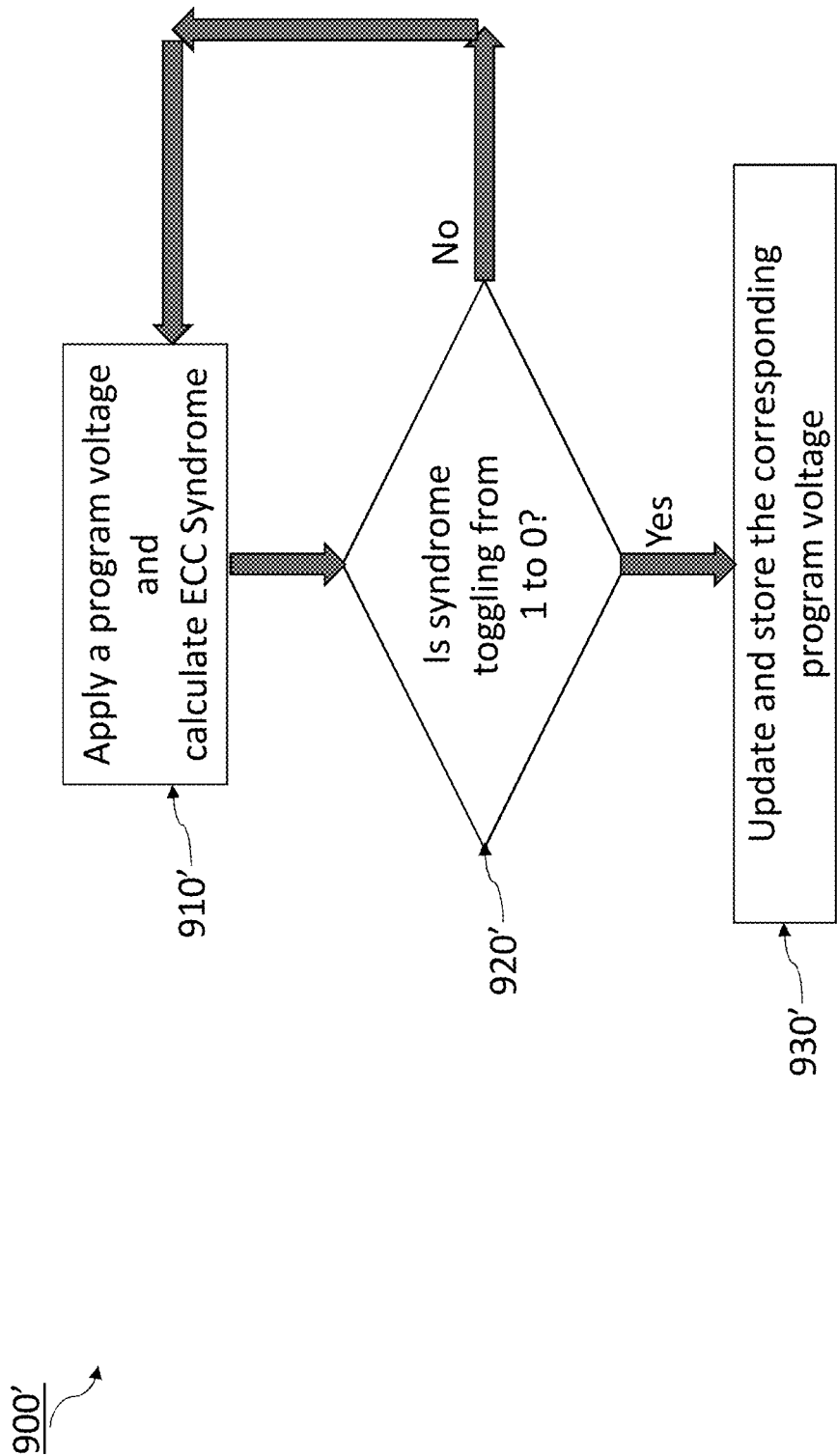

At this stage, a parallel process 900', as illustrated in FIG. 9B, is started by performing, at step 910', an ECC verify operation on the programmed bits and determining the value of the syndrome of said ECC.

More in particular, based on the syndrome of the ECC, the programming voltage values corresponding to an ECC syndrome toggling from a first value (e.g. 1) to a second value (e.g. 0) are stored, while the programming voltage values corresponding to an ECC syndrome different from the second value are ignored, as shown at step 920'. The voltage values corresponding to syndrome 0 are stored and updated into a register of the array at step 930'

Referring again to FIG. 9A, the process of FIG. 9B is then invoked at step 950 and the stored programming voltages are used at step 960 to establish whether the actual programming voltage is lower than the maximum expected threshold voltage. More in particular, the last voltage value resulting in a stable syndrome equal to the 0 is regarded as the maximum threshold value and is used to calculate, at step 970, information σN representative of the voltage difference between the programming voltage (e.g. the last voltage step of a ramp) used to program the first group of memory cells and said last programming voltage value (i.e. the voltage step of a ramp) used to program the memory cells to the first logic state within the ECC correction capability, obtaining the data information ΔN to be stored in the codeword to improve the reading operation.

Figure 10:
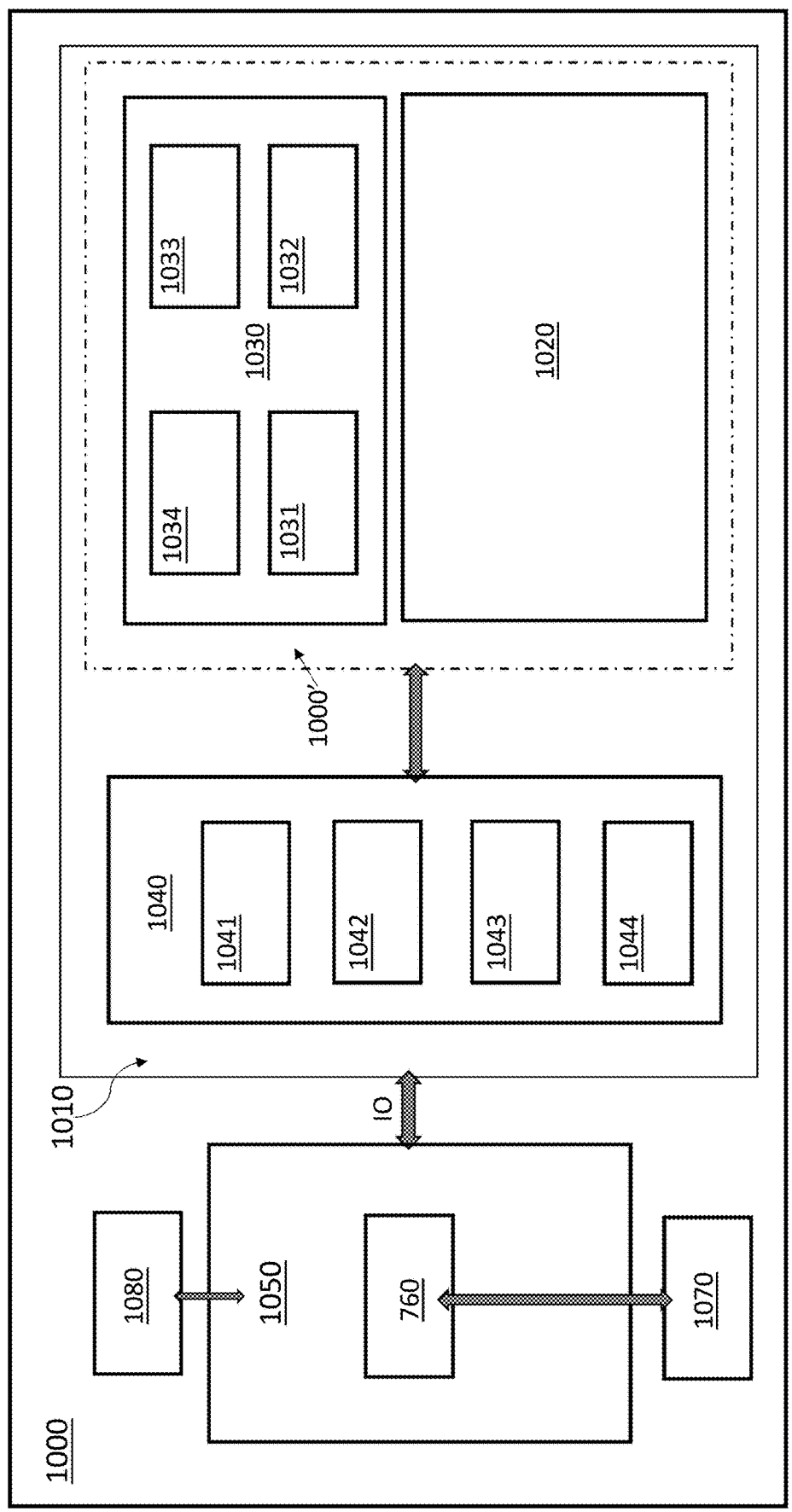
FIG. 10 shows a schematic block diagram of a system including a memory device according to the disclosure.

FIG. 10 is a high-level scheme of a system 1000 that can perform the read algorithm of the present disclosure. The system 1000 includes a memory device 1010 in turn including an array of memory cells 1020 and a circuit 1030 operatively coupled to the memory cells 1020; the memory cells 1020 and the circuit 1030 form a memory portion, herein referred to as memory portion 1000'.

The memory device 1010 comprises a memory controller 1040, which represents control logic that generates memory access commands, for example in response to command by a host 1050. Memory controller 1040 accesses memory portion 1000'. In one embodiment, memory controller 1040 can also be implemented in the host 1050, in particular as part of a host processor 760, even if the present disclosure is not limited by a particular architecture. The controller 1040 can include an embedded firmware and is adapted to manage and control the operation of the memory portion 1000'.

In general, the memory controller 1040 may receive user data through input/output IO. As shown before, in some embodiments, the memory controller encodes the user data to satisfy a condition prior to storing the user data in memory cells. The condition may be satisfied when encoded user data have a predetermined number of bits exhibiting a given logic value (e.g., a logic value of 1). As a way of example, the encoded user data may be configured to have 50% of the memory cells storing the encoded user data to exhibit the logic state of 1 while the other 50% of the memory cells to exhibit a logic state of 0 (i.e. the balanced encoding scheme, where half of the encoded user data bits have a logic state of 1, and the other half have a logic state of 0). During the encoding process, the memory controller 1040 may add a certain number of bits (e.g., parity bits) to the user data to establish the predetermined number of memory cells to exhibit the given logic state. As a result of adding the parity bits, the encoded user data may have more bits than the user data. In some embodiments, a different percentage value (e.g., 40%, 60%, 75%) of the memory cells exhibiting the logic state of 1 may be employed during the encoding process.

The value of the voltage difference ΔN may be stored by the memory controller 1040 in the array as a codeword portion.

The memory device 1010 can also comprise other components, such as processor units coupled to the controller 1040, antennas, connection means (not shown) with the host device, and the like.

Multiple signal lines couple the memory controller 1040 with the memory portion 1000'. For example, such signal lines may include clock, command/address and write data (DQ), read DQ, and zero or more other signal lines. The memory controller 1040 is thus operatively coupled to the memory portion 1000' via suitable buses.

The memory portion 1000' represents the memory resource for the system 1000. In one embodiment, the array of memory cells 1020 is managed as rows of data, accessed via wordline (rows) and bitline (individual bits within a row) control. In one embodiment, the array 1020 of memory cells includes a 3D crosspoint array such as the memory cell array 200 of FIG. 2. The array 1020 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, the memory controller 1040 includes refresh (REF) logic 1041. In one embodiment, refresh logic 1041 indicates a location for refresh, and a type of refresh to perform. Refresh logic 1041 can trigger self-refresh within memory, and issue external refreshes by sending refresh commands to trigger the execution of a refresh operation.

In one embodiment, access circuitry 1031 of the circuit 1030 performs a refresh (e.g., reprogramming) of any of the accessed memory cells that were not refreshed during the read sequence. Therefore, a complete refresh of memory cells can be achieved as mostly a side effect of the memory read sequence with minimal additional refresh operations.

In an embodiment, the circuit can also be embedded in the memory controller, even if the present disclosure is not limited by a particular architecture.

In the exemplary embodiment illustrated in FIG. 10, the memory controller 1040 includes error correction circuitry 1042. The error detection/correction circuitry 1042 can include hardware logic to implement an error correction code (ECC) to detect errors occurring in data read from memory portion. In one embodiment, error detection/correction circuitry 1042 also corrects errors (up to a certain error rate based on the implemented ECC code). However, in other embodiments, error detection/correction circuitry 1042 detects but does not correct errors.

More in particular, the controller 1040 may be configured to encode user data according to an Error Correction Code (ECC) scheme, and may comprise a syndrome calculation unit configured to produce, from the encoded set of user data, a syndrome value, the controller being configured so that, when the syndrome value is zero, the corresponding programming voltage value is stored in a register and/or latch of the array and, when the syndrome is different from zero, the corresponding programming voltage is ignored, wherein the second threshold voltage is the last programming voltage corresponding to a syndrome equal to zero, the controller being configured to update in said register or latch the programming voltage anytime the ECC syndrome is toggling from a value different from zero to zero, according to an architecture analogous to the one shown in FIG. 7.

In an embodiment, the first threshold voltage is the median threshold voltage value of the memory cells in the first logic state, the controller being configured to track said median value.

In the illustrated embodiment, the memory controller 1040 includes command (CMD) logic 1043, which represents logic or circuitry to generate commands to send to memory portion. The memory controller 1040 may also include a counter 1044, such as the per-codeword counter disclosed above and configured to count the number of bits switched during the read operation. Clearly, also other architectures can be employed, for example the counter can be embedded in the host 1050 or also in the circuit 1030.

Based on the received command and address information, access circuitry 1031 of the circuit 1030 performs operations to execute the commands, such as the read operation of the present disclosure. In one such embodiment, the circuit 1030 includes sense circuitry 1032 to detect electrical responses of the one or more memory cells to the applied read voltage. In one embodiment, the sense circuitry 1032 includes sense amplifiers. FIG. 10 illustrates the access circuitry 1031 and sense circuitry 1032 as being embedded in the memory portion 1000', however, other embodiments can include access circuitry and/or sense circuitry that is separate from the memory portion 1000'. For example, access circuitry and sense circuitry can be included in a memory controller such as the memory controller 1040.

Sense circuitry may be configured to detect a current through a given memory cell in response to the read voltage, wherein the access circuitry is configured to determine that the given memory cell is in the first logic state based on detection that a magnitude of the current is greater than or equal to a threshold current.

In one embodiment, memory portion 1000' includes one or more registers 1033. The registers 1033 represent one or more storage devices or storage locations that provide configuration or settings for the operation of the memory portion. Furthermore, in one embodiment, the circuit 1030 includes also decode circuitry 1034.

The host device 1050 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The memory device 1010 may also be embedded in the host device 1050.

In one embodiment, the system 1000 includes an interface 1070 coupled to the processor 760, which can represent a higher speed interface or a high throughput interface for system components that use higher bandwidth connections, and/or graphics interface components. Graphics interface interfaces to graphics components for providing a visual display to a user of system 1000. In one embodiment, graphics interface generates a display based on data stored in the memory device or based on operations executed by processor or both.

The system may also comprise network interface 1080 communicatively coupled to the host or to memory device for example for connecting with other systems, and/or a battery coupled to provide power to said system.

In conclusion, the present disclosure provides a read and programming method based on the switching of a predetermined and the subsequent application of a read pulse determined, codeword by codeword, according to the actual statistical distribution of bits in the codeword, improving the performances of the array.

According to an exemplary embodiment, a method for operating (accessing) an array of memory cells comprises the steps of storing a set of user data in a plurality of memory cells of the memory array, storing, in a portion of the memory array, additional data information, these additional data information being a voltage difference between a first threshold voltage and a second threshold voltage of the memory cells of the set of user data programmed to a first logic state, wherein the first threshold voltage is a voltage to activate a preset number of memory cells programmed to the first logic state, and wherein the second threshold voltage is a voltage to activate memory cells programmed to the first logic state having a threshold voltage whose magnitude is higher than the first threshold voltage and is based on the statistical distribution of the threshold voltages of the memory cells of the set of user data, applying to the memory array a read voltage to activate a first group of memory cells corresponding to the preset number of memory cells, determining that the first group of memory cells has been activated based on applying the read voltage, wherein said read voltage is equal to the first threshold voltage when the first group of memory cells has been activated, and, based on the additional data information (i.e. after reading the additional data information), applying the voltage difference to the memory array to activate a second group of memory cells programmed to the first logic state.

According to another exemplary embodiment, a method for programming an array of memory cells comprises the steps of encoding user data according to an Error Correction Code (ECC) scheme, applying a programming voltage for programming to a first logic state the memory cells of the array (i.e. storing the user data in the first logic state), determining that a predetermined first group of memory cells has been switched to an active state based on the application of the programming voltage, storing, in a portion of the memory array, the programming voltage corresponding to the switching to the active state of all the cells of the predetermined first group of memory cells, performing, while applying the programming voltage to the array to program all cells to the first logic state, an ECC verify operation and determining the value of the syndrome of said ECC, based on the syndrome of the ECC, storing the programming voltage values corresponding to an ECC syndrome toggling from a first value to a second value and ignoring the programming voltage values corresponding to an ECC syndrome different from the second value, storing, in a portion of the memory array, the voltage difference between the programming voltage used to program the first group of memory cells and the last programming voltage value used to program the memory cells to the first logic state within the ECC correction capability, said last voltage value resulting in a toggling to a stable ECC syndrome equal to the second value. In an embodiment, the first value of the syndrome is different from zero and the second value is zero.

If not explicitly indicated, method steps are not necessarily in the indicated sequence.

The present disclosure also discloses a memory device comprising an array of memory cells, at least a codeword in the memory array including a set of user data and additional data information, these additional data information being a voltage difference between a first threshold voltage and a second threshold voltage of the memory cells of the set of user data programmed to a first logic state, wherein the first threshold voltage is a voltage to activate a preset number of memory cells programmed to the first logic state, and wherein the second threshold voltage is a voltage to activate memory cells programmed to the first logic state having a threshold voltage whose magnitude is higher than the first threshold voltage and is based on the statistical distribution of the threshold voltages of the memory cells of the set of user data, the device further comprising a memory controller configured to execute instructions for accessing the memory cells, and a circuit for accessing the memory cells, the circuit being operatively coupled with the array of memory cells and comprising at least an access circuit configured to apply to the memory array a read voltage to activate a first group of memory cells corresponding to the preset number of memory cells, a sense circuit configured to determine that the first group of memory cells has been activated based on applying the read voltage, wherein said read voltage is equal to the first threshold voltage when the first group of memory cells has been activated, wherein, based on the additional data information stored in the memory array, the controller is configured to control the access circuit to apply the voltage difference to the memory array to activate a second group of memory cells programmed to the first logic state. In an embodiment, the array of memory cells comprises a Self-Selecting Memory (SSM) or a 3D cross point (3D X Point) memory.

A related system, comprising a host device and a memory device as above is also disclosed, the system comprising for example any of a display communicatively coupled to the memory device or to the host, a network interface communicatively coupled to the memory device or to the host, and a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for accessing a memory array of memory cells, comprising:
   storing a set of user data in a plurality of memory cells of the memory array;
   storing, in a portion of the memory array, additional data information that is representative of a voltage difference between a first threshold voltage and a second threshold voltage of the memory cells of the set of user data programmed to a first logic state, wherein the first threshold voltage is a voltage to activate a preset number of memory cells programmed to the first logic state, and wherein the second threshold voltage is a voltage to activate memory cells programmed to the first logic state having a threshold voltage whose magnitude is higher than the first threshold voltage and is based at least in part on a statistical distribution of the threshold voltages of the memory cells of the set of user data;
   applying to the memory array a read voltage to activate a first group of memory cells corresponding to the preset number of memory cells;
   determining that the first group of memory cells has been activated based on applying the read voltage, wherein the read voltage is based at least in part on the first threshold voltage when the first group of memory cells has been activated; and
   based on the additional data information, applying the voltage difference to the memory array to activate a second group of memory cells programmed to the first logic state.

2. The method of claim 1, wherein the memory cells of the second group of memory cells have threshold voltages whose magnitude is between the first threshold voltage and the second threshold voltage, the read voltage being greater than an upper limit of the threshold voltage of the memory cells programmed to the first logic state.

3. The method of claim 1, wherein the second threshold voltage is a programming voltage corresponding to an activation of the memory cells in the first logic state and an Error Correction Code (ECC) correction capability associated with programming the memory cells to the first logic state.

4. The method of claim 3, wherein storing the set of user data comprises computing a syndrome of the ECC, wherein:
when the syndrome is toggling from a value different from zero to zero, the corresponding programming voltage is stored; and
when the syndrome is different from zero, the corresponding programming voltage is ignored, and wherein the second threshold voltage is a last programming voltage corresponding to the syndrome equal to zero.

5. The method of claim 1, further comprising:
applying an additional margin read voltage after applying the voltage difference to account for voltage threshold distributions enlarging with time.

6. The method of claim 1, further comprising:
performing an Error Correction Code (ECC) verify operation after applying the voltage difference; and
applying a second read voltage when the ECC verify operation results in an error to be corrected in the set of user data.

7. The method of claim 1, wherein the first threshold voltage is a median threshold voltage value of the memory cells in the first logic state.

8. The method according to claim 1, further comprising:
encoding the set of user data in a codeword having a number of bits exhibiting the first logic state in a range, the encoding comprising manipulating the codeword to constrain the number of bits exhibiting the first logic state in the range.

9. The method according to claim 8, wherein the encoded set of user data have substantially a same number of bits exhibiting the first logic state and a second logic state, and wherein the memory cells exhibit a threshold voltage with a lower magnitude when the memory cells are in the first logic state, and a threshold voltage with a higher magnitude when the memory cells are in the second logic state, and wherein a logic state of a given cell is determined based on whether the given cell exhibits a higher or lower magnitude threshold voltage in response to the read voltage.

10. The method according to claim 1, wherein the additional data information comprises bits protected using an Error Correction Code (ECC), a differential cells scheme, or both.

11. The method of claim 1, wherein the read voltage is a staircase voltage ramp.

12. A method for programming a memory array of memory cells, comprising:
encoding user data according to an Error Correction Code (ECC) scheme;
applying a programming voltage for programming to a first logic state the memory cells of the memory array;
determining that a first group of memory cells has been switched to an active state based on the application of the programming voltage;
storing, in a portion of the memory array, the programming voltage corresponding to the first group of memory cells switching to the active state;
performing an ECC verify operation and determining a value of a syndrome of the ECC;
based on the syndrome of the ECC, storing programming voltage values corresponding to the syndrome toggling from a first value to a second value and ignoring the programming voltage values corresponding to an ECC syndrome different than the second value; and
storing a voltage difference between the programming voltage used to program the first group of memory cells and a last programming voltage value used to program the memory cells to the first logic state resulting in a toggling of the syndrome to the second value.

13. The method of claim 12, wherein the first value of the syndrome is different from zero and the second value is zero.

14. The method of claim 12, further comprising:
storing, during the application of the programming voltage, a corresponding voltage value to update a previous value based at least on the syndrome toggling from a value different from zero to zero.

15. The method of claim 12, wherein the memory array of memory cells are included in vertical 3D memory devices.

16. The method of claim 12, wherein encoding the user data comprises:
encoding the user data in a codeword having a number of bits exhibiting the first logic state in a range, the encoding comprising manipulating the codeword to constrain the number of bits exhibiting the first logic state in the range, wherein the encoded user data have substantially a same number of bits exhibiting the first logic state and a second logic state.

17. The method of claim 12, wherein the programming voltage comprises a staircase voltage ramp.

18. The method of claim 12, further comprising:
after programming the memory cells to the first logic state, performing a write-back operation for programming further memory cells of the memory array to a second logic state,
wherein the memory cells programmed to the second logic state are initially masked in such a way that, during the application of the programming voltage for programming the memory cells to the first logic state, the masked cells are regarded as memory cells already programmed to the second logic state.

19. The method of claim 12, wherein each codeword stored in the memory array comprises respective additional data information associated thereto.

20. A memory device comprising:
a memory array of memory cells;
at least a codeword in the memory array including a set of user data and additional data information, the additional data information representing a voltage difference between a first threshold voltage and a second threshold voltage of the memory cells of the set of user data programmed to a first logic state, wherein the first threshold voltage is a voltage to activate a preset number of memory cells programmed to the first logic state, and wherein the second threshold voltage is a voltage to activate memory cells programmed to the first logic state having a threshold voltage whose magnitude is greater than the first threshold voltage and is based at least in part on a statistical distribution of the threshold voltages of the memory cells of the set of user data;
a memory controller configured to execute instructions for accessing the memory cells; and
a circuit for accessing the memory cells, the circuit being operatively coupled with the memory array of memory cells and comprising:

an access circuit configured to apply to the memory array, a read voltage to activate a first group of memory cells corresponding to the preset number of memory cells; and a sense circuit configured to determine that the first group of memory cells has been activated based on applying the read voltage, wherein the read voltage is equal to the first threshold voltage, wherein, based on the additional data information stored in the memory array, the memory controller is configured to control the access circuit to apply the read voltage and the voltage difference to the memory array to activate a second group of memory cells programmed to the first logic state.

21. The memory device of claim 20, wherein the sense circuit is configured to detect a current through a memory cell in response to applying the read voltage, and wherein the access circuit is configured to determine that the memory cell is in the first logic state based on detection that a magnitude of the current is greater than or equal to a first threshold current.

22. The memory device of claim 20, wherein the read voltage comprises a staircase voltage ramp.

23. The memory device of claim 20, wherein the memory array of memory cells comprises a Self-Selecting Memory (SSM) or a 3D cross point (3D X Point) memory.

24. The memory device of claim 20, wherein the memory controller is configured to encode user data according to an Error Correction Code (ECC) scheme.

25. The memory device of claim 24, further comprising:
a syndrome calculation unit configured to produce, from the encoded user data, a syndrome value, the memory controller being configured to store, when the syndrome value is toggling from a value different from zero to zero, a corresponding programming voltage value in a register, a latch, or both of the memory array and to ignore, when the syndrome value is different from zero, the corresponding programming voltage value, wherein the second threshold voltage is a last programming voltage corresponding to the syndrome value equal to zero, the memory controller being configured to update in the register, the latch, or both the programming voltage value anytime the syndrome value toggles from a value different from zero to zero.

26. The memory device of claim 20, wherein the access circuit is configured to apply an additional margin read voltage after applying a second read voltage to account for voltage threshold distributions enlarging with time, and/or to perform an Error Correction Code (ECC) verify operation after applying the second read voltage and to apply the second read voltage when the ECC verify operation results in an error to be corrected in the set of user data.

27. The memory device of claim 20, wherein the first threshold voltage is a median threshold voltage value of the memory cells that store the first logic state, the memory controller being configured to track the median threshold voltage value.

* * * * *